US 12,159,815 B2

(12) United States Patent
Tu et al.

(10) Patent No.: US 12,159,815 B2
(45) Date of Patent: Dec. 3, 2024

(54) CONNECTION ARRANGEMENTS FOR INTEGRATED LATERAL DIFFUSION FIELD EFFECT TRANSISTORS HAVING A BACKSIDE CONTACT

(71) Applicant: Silanna Asia Pte Ltd, Singapore (SG)

(72) Inventors: Shanghui Larry Tu, San Diego, CA (US); Michael A. Stuber, Rancho Santa Fe, CA (US); Befruz Tasbas, San Diego, CA (US); Stuart B. Molin, Carlsbad, CA (US); Raymond Jiang, Raleigh, NC (US)

(73) Assignee: Silanna Pte Ltd, Singapore (SG)

( * ) Notice: Subject to any disclaimer, the term of this patent is extended or adjusted under 35 U.S.C. 154(b) by 297 days.

(21) Appl. No.: 17/660,721

(22) Filed: Apr. 26, 2022

(65) Prior Publication Data

US 2022/0278027 A1    Sep. 1, 2022

Related U.S. Application Data

(63) Continuation of application No. 16/737,524, filed on Jan. 8, 2020, now Pat. No. 11,335,627, which is a (Continued)

(51) Int. Cl.
*H01L 23/495*      (2006.01)
*H01L 23/535*      (2006.01)
(Continued)

(52) U.S. Cl.
CPC .. *H01L 23/49517* (2013.01); *H01L 23/49524* (2013.01); *H01L 23/49562* (2013.01);
(Continued)

(58) Field of Classification Search
None
See application file for complete search history.

(56) References Cited

U.S. PATENT DOCUMENTS 4,738,936 A    4/1988 Rice
5,365,102 A    11/1994 Mehrotra et al.
(Continued)

FOREIGN PATENT DOCUMENTS

CN    102760769 A    10/2012
CN    203882995 U    10/2014
(Continued)

OTHER PUBLICATIONS

International Search Report dated May 16, 2018 for PCT Patent Application Nu. PCT/IB2018/050905.
(Continued)

*Primary Examiner* — Grant S Withers
(74) *Attorney, Agent, or Firm* — MLO, a professional corp.

(57) ABSTRACT

A semiconductor package includes a leadframe having an electrically conductive paddle, electrically conductive perimeter package leads, a first electrically conductive clip electrically connected to a first set of the package leads, and a second electrically conductive clip electrically connected to a second set of the package leads. The semiconductor package includes a single semiconductor die. The die includes a front-side active layer having an integrated power structure of two or more transistors. The die includes a backside portion having a backside contact electrically coupled to at least one of the two or more transistors and to the paddle. One or more first front-side contacts of the die are electrically coupled to at least one of the transistors and to the first clip, and one or more second front-side contacts of the die are electrically coupled to at least one of the transistors and to the second clip.

11 Claims, 17 Drawing Sheets

Related U.S. Application Data continuation of application No. 16/137,300, filed on Sep. 20, 2018, now Pat. No. 10,546,804, which is a continuation of application No. 15/640,081, filed on Jun. 30, 2017, now Pat. No. 10,083,897, which is a continuation-in-part of application No. 15/588,357, filed on May 5, 2017, now Pat. No. 9,923,059.

(60) Provisional application No. 62/461,117, filed on Feb. 20, 2017.

(51) Int. Cl.
| | | |
|---|---|---|
| *H01L 23/66* | (2006.01) | |
| *H01L 27/12* | (2006.01) | |
| *H01L 29/06* | (2006.01) | |
| *H01L 29/417* | (2006.01) | |
| *H01L 29/66* | (2006.01) | |
| *H01L 29/78* | (2006.01) | |
| *H01L 29/786* | (2006.01) | |
| *H01L 21/8234* | (2006.01) | |
| *H01L 27/088* | (2006.01) | |
| *H01L 29/08* | (2006.01) | |
| *H01L 29/40* | (2006.01) | |

(52) U.S. Cl.
CPC ...... *H01L 23/49575* (2013.01); *H01L 23/535* (2013.01); *H01L 27/1203* (2013.01); *H01L 29/0623* (2013.01); *H01L 29/4175* (2013.01); *H01L 29/41766* (2013.01); *H01L 29/66681* (2013.01); *H01L 29/66696* (2013.01); *H01L 29/7816* (2013.01); *H01L 29/7824* (2013.01); *H01L 29/78615* (2013.01); *H01L 29/78639* (2013.01); *H01L 21/823475* (2013.01); *H01L 27/088* (2013.01); *H01L 29/0692* (2013.01); *H01L 29/0696* (2013.01); *H01L 29/086* (2013.01); *H01L 29/0878* (2013.01); *H01L 29/402* (2013.01); *H01L 2224/40245* (2013.01)

(56) References Cited

U.S. PATENT DOCUMENTS

| | | | |
|---|---|---|---|
| 5,378,912 A | 1/1995 | Pein | |
| 5,382,818 A | 1/1995 | Pein | |
| 5,521,414 A | 5/1996 | Palara | |
| 5,548,150 A | 8/1996 | Omura et al. | |
| 5,559,044 A | 9/1996 | Williams et al. | |
| 5,773,852 A | 6/1998 | Han et al. | |
| 5,869,875 A | 2/1999 | Hebert | |
| 5,889,310 A | 3/1999 | Terashima et al. | |
| 6,025,237 A | 2/2000 | Choi | |
| 6,049,108 A | 4/2000 | Williams et al. | |
| 6,078,090 A | 6/2000 | Williams et al. | |
| 6,084,284 A | 7/2000 | Adamic | |
| 6,294,838 B1 | 9/2001 | Peng | |
| 6,355,501 B1 | 3/2002 | Fung et al. | |
| 6,476,442 B1 | 11/2002 | Williams et al. | |
| 6,692,998 B2 | 2/2004 | Maciejewski et al. | |
| 6,794,719 B2 | 9/2004 | Petruzzello et al. | |
| 7,008,821 B1 | 3/2006 | Shao et al. | |
| 7,235,845 B2 | 6/2007 | Xu et al. | |
| 7,273,771 B2 | 9/2007 | Kinzer | |
| 7,282,765 B2 | 10/2007 | Xu et al. | |
| 7,420,247 B2 | 9/2008 | Xu et al. | |
| 7,446,375 B2 | 11/2008 | Xu et al. | |
| 7,560,808 B2 | 7/2009 | Korec et al. | |
| 7,576,388 B1 | 8/2009 | Wilson et al. | |
| 7,589,378 B2 | 9/2009 | Kocon et al. | |
| 7,598,128 B2 | 10/2009 | Hsu et al. | |
| 7,629,645 B2 | 12/2009 | Montanini et al. | |
| 7,713,821 B2 | 5/2010 | Hsu et al. | |
| 7,719,054 B2 | 5/2010 | Williams et al. | |
| 7,745,846 B2 | 6/2010 | Korec et al. | |
| 7,745,920 B2 | 6/2010 | Lee et al. | |
| 7,829,947 B2 | 11/2010 | Hébert | |
| 7,842,568 B2 | 11/2010 | Anderson et al. | |
| 7,952,145 B2 | 5/2011 | Korec et al. | |
| 8,101,993 B2 | 1/2012 | Hsieh | |
| 8,198,154 B2 | 6/2012 | Hebert | |
| 8,513,119 B2 | 8/2013 | Chang et al. | |
| 8,674,440 B2 | 3/2014 | Korec et al. | |
| 8,847,310 B1 | 9/2014 | Korec | |
| 8,928,116 B2 | 1/2015 | Korec et al. | |
| 8,994,105 B2 | 3/2015 | Korec | |
| 8,994,115 B2 | 3/2015 | Korec et al. | |
| 9,159,825 B2 | 10/2015 | Molin et al. | |
| 9,324,838 B2 | 4/2016 | Cascino et al. | |
| 9,349,677 B2 | 5/2016 | Cho et al. | |
| 9,373,571 B2 | 6/2016 | Denison et al. | |
| 9,412,881 B2 | 8/2016 | Korec et al. | |
| 9,412,911 B2 | 8/2016 | Atankackovic | |
| 9,466,536 B2 | 10/2016 | Goktepeli et al. | |
| 9,524,957 B2 | 12/2016 | Hebert et al. | |
| 9,530,796 B2 | 12/2016 | Stuber et al. | |
| 9,583,477 B2 | 2/2017 | Cho et al. | |
| 9,589,929 B2 | 3/2017 | Terrill et al. | |
| 10,083,897 B2 | 9/2018 | Tu et al. | |
| 2002/0017697 A1 | 2/2002 | Kitamura et al. | |
| 2003/0094654 A1 | 5/2003 | Christensen et al. | |
| 2004/0201061 A1 | 10/2004 | Jeon et al. | |
| 2004/0238913 A1 | 12/2004 | Kwon et al. | |
| 2004/0245633 A1 | 12/2004 | Alter et al. | |
| 2006/0001110 A1 | 1/2006 | Igarashi | |
| 2006/0261382 A1 | 11/2006 | Khemka et al. | |
| 2007/0013008 A1 | 1/2007 | Xu et al. | |
| 2007/0034942 A1 | 2/2007 | Xu et al. | |
| 2007/0080431 A1 | 4/2007 | Hung et al. | |
| 2007/0108469 A1 | 5/2007 | Nakano et al. | |
| 2007/0138548 A1 | 6/2007 | Kocon et al. | |
| 2007/0235769 A1 | 10/2007 | La Rosa et al. | |
| 2008/0012043 A1 | 1/2008 | Udrea et al. | |
| 2008/0023785 A1 | 1/2008 | Hebert | |
| 2008/0038912 A1 | 2/2008 | Hess et al. | |
| 2008/0122006 A1 | 5/2008 | Williams et al. | |
| 2008/0150094 A1 | 6/2008 | Anderson | |
| 2008/0197411 A1 | 8/2008 | Korec et al. | |
| 2008/0246086 A1 | 10/2008 | Korec et al. | |
| 2008/0315304 A1 | 12/2008 | Hsu et al. | |
| 2009/0179264 A1 | 7/2009 | Korec et al. | |
| 2009/0273029 A1 | 11/2009 | Tien et al. | |
| 2010/0002374 A1 | 1/2010 | Sasagawa et al. | |
| 2010/0025763 A1 | 2/2010 | Paul et al. | |
| 2010/0127347 A1 | 5/2010 | Quinn | |
| 2010/0171543 A1 | 7/2010 | Korec et al. | |
| 2010/0237414 A1 | 9/2010 | Hsieh | |
| 2010/0301413 A1 | 12/2010 | You | |
| 2010/0314683 A1 | 12/2010 | Yanagi | |
| 2010/0315159 A1 | 12/2010 | Kocon et al. | |
| 2011/0024839 A1 | 2/2011 | Zinn et al. | |
| 2011/0084314 A1 | 4/2011 | Or-Bach et al. | |
| 2011/0127602 A1 | 6/2011 | Mallikarjunaswamy | |
| 2011/0148376 A1 | 6/2011 | Xu et al. | |
| 2011/0148506 A1 | 6/2011 | Korec et al. | |
| 2011/0198927 A1 | 8/2011 | Korec et al. | |
| 2011/0241170 A1 | 10/2011 | Haeberlen et al. | |
| 2011/0292632 A1 | 12/2011 | Wen et al. | |
| 2011/0303976 A1 | 12/2011 | Kocon et al. | |
| 2011/0309438 A1 | 12/2011 | Ichijo et al. | |
| 2012/0012982 A1 | 1/2012 | Korec et al. | |
| 2012/0032262 A1 | 2/2012 | Toren et al. | |
| 2012/0181681 A1 | 7/2012 | Cho et al. | |
| 2012/0220091 A1 | 8/2012 | Challa et al. | |
| 2012/0228696 A1 | 9/2012 | Carpenter et al. | |
| 2012/0299119 A1 | 11/2012 | Xue et al. | |
| 2012/0326287 A1 | 12/2012 | Joshi et al. | |
| 2013/0009253 A1 | 1/2013 | Wang et al. | |
| 2013/0069163 A1 | 3/2013 | Bhalla et al. | |
| 2014/0002935 A1 | 1/2014 | Chen et al. | |
| 2014/0035047 A1 | 2/2014 | Korec et al. | |
| 2014/0061884 A1 | 3/2014 | Carpenter et al. | |
| 2014/0167269 A1 | 6/2014 | Lu et al. | |

(56) References Cited

U.S. PATENT DOCUMENTS

| | | |
|---|---|---|
| 2014/0210107 A1 | 7/2014 | Zhai |
| 2014/0264611 A1 | 9/2014 | Lee et al. |
| 2014/0273344 A1 | 9/2014 | Terrill et al. |
| 2016/0005675 A1 | 1/2016 | Tong |
| 2016/0064361 A1 | 3/2016 | Denison et al. |
| 2016/0099238 A1 | 4/2016 | Niu et al. |
| 2017/0221885 A1 | 8/2017 | Sander et al. |

FOREIGN PATENT DOCUMENTS

| | | |
|---|---|---|
| CN | 104253122 A | 12/2014 |
| DE | 19647324 A1 | 5/1997 |
| KR | 20100065992 A | 6/2010 |
| KR | 20100087115 A | 8/2010 |
| KR | 20130119439 A | 10/2013 |
| TW | 200729442 A | 8/2007 |
| TW | 200805510 A | 1/2008 |
| TW | 200921893 A | 5/2009 |
| TW | 201133856 A | 10/2011 |
| TW | 201244052 A | 11/2012 |
| TW | 201643996 A | 12/2016 |
| WO | 2003036699 A3 | 9/2003 |

OTHER PUBLICATIONS

International Search Report dated May 21, 2018 for PCT Patent Application Nu. PCT/IB2018/050907.
International Search Report dated May 21, 2018 for PCT Patent Application Nu. PCT/IB2018/050909.
Nenadovic, et al., "RF Power Silicon-on-Glass VDMOSFETs," IEEE, vol. 25, No. 6, Jun. 2004, pp. 424-426.
Nenadovic, et al., "VDMOS and LDMOS transistors for RF-power applications," ResearchGate, Nov. 2002, pp. 61-68.
Notice of Allowance and Fees dated Jan. 26, 2022 for U.S. Appl. No. 16/737,524.
Notice of Allowance dated Jun. 19, 2019 for U.S. Appl. No. 16/252,168.
Notice of Allowance dated May 17, 2019 for U.S. Appl. No. 15/680,034.
Notice of Allowance dated May 29, 2018 for U.S. Appl. No. 15/640,081.
Notice of Allowance dated Nov. 28, 2018 for U.S. Appl. No. 15/899,911.
Notice of Allowance dated Nov. 9, 2017 for U.S. Appl. No. 15/588,357.
Notice of Allowance dated Sep. 25, 2019 for U.S. Appl. No. 16/137,300.
Notice of Allowance dated Sep. 26, 2018 for U.S. Appl. No. 15/853,357.
Office Action dated Dec. 15, 2017 for U.S. Appl. No. 15/640,081.
Office Action dated Feb. 6, 2019 for U.S. Appl. No. 15/680,034.
Office Action dated Jul. 2, 2021 for Taiwan, Province of China Patent Application No. 107105557.
Office Action dated Jun. 24, 2019 for U.S. Appl. No. 16/137,300.
Office Action dated Oct. 7, 2021 for U.S. Appl. No. 16/737,524.
Office Action dated Sep. 5, 2017 for U.S. Appl. No. 15/588,357.
Official Letter and Search Report dated Jun. 1, 2021 for Taiwan Patent Application No. 107105556.
Official Letter and Search Report dated Sep. 22, 2021 for Taiwan Patent Application No. 107105595.
Yuanzheng Zhu et al., "Folded Gate LDMOS Transistor with Low On-Resistance and High Transconductance," IEEE vol. 48, No. 12, Dec. 2001, pp. 2917-2928.
Office Action dated Feb. 1, 2023 for China Patent Application No. 201880012873.0.
Office Action dated Jan. 31, 2023 for China Patent Application No. 201880012916.5.
Office Action dated Aug. 31, 2023 for China Patent Application No. 201880012873.0.
Office Action dated Sep. 1, 2023 for China Patent Application No. 201880012916.5.
Office Action dated Mar. 30, 2023 for Japan Patent Application No. 2021-569565.

CONNECTION ARRANGEMENTS FOR INTEGRATED LATERAL DIFFUSION FIELD EFFECT TRANSISTORS HAVING A BACKSIDE CONTACT

CROSS-REFERENCE TO RELATED APPLICATION

This application is a continuation of U.S. patent application Ser. No. 16/737,524 filed on Jan. 8, 2020, and entitled "Connection Arrangements for Integrated Lateral Diffusion Field Effect Transistors Having a Backside Contact", which is a continuation of U.S. patent application Ser. No. 16/137,300 filed on Sep. 20, 2018, and entitled "Connection Arrangements for Integrated Lateral Diffusion Field Effect Transistors Having a Backside Contact", which is a continuation of U.S. patent application Ser. No. 15/640,081 (U.S. Pat. No. 10,083,897 B2) filed on Jun. 30, 2017, and entitled "Connection Arrangements for Integrated Lateral Diffusion Field Effect Transistors Having a Backside Contact", which is a continuation-in-part of U.S. patent application Ser. No. 15/588,357 (U.S. Pat. No. 9,923,059) filed on May 5, 2017, and entitled "Connection Arrangements for Integrated Lateral Diffusion Field Effect Transistors," which claims the benefit of U.S. Provisional Application No. 62/461,117, filed Feb. 20, 2017, and entitled "Backside Contact Integrated Laterally Diffused MOS Apparatus and Methods," all of which are incorporated by reference herein in their entirety.

BACKGROUND

Semiconductor power devices are specialized devices that typically are used as switches or rectifiers in power electronics circuits. Semiconductor power devices are characterized by their ability to withstand high voltages and large currents as well as the high temperatures associated with high power operation. For example, a switching voltage regulator typically includes two power devices that constantly switch on and off in a synchronized manner to regulate a voltage. The power devices in this situation need to sink system-level current in the on state, withstand the full potential of the power supply in the off state, and dissipate a large amount of heat. The ideal power device is able to operate in high power conditions, can rapidly switch between on and off states, and exhibits low thermal and on-state resistance.

A typical semiconductor power device package includes a set of discrete power transistors each of which is fabricated on its own respective semiconductor die. The individual dice are encapsulated in an insulating mold compound with a leadframe structure that provides external electrical connections for individual devices or integrated circuits formed in the semiconductor dice. The leadframe structure typically includes a central paddle surrounded by leads. The semiconductor dice typically are mounted on the paddle, and semiconductor die pads on the semiconductor dice are electrically connected to respective ones of the leads. For each discrete power transistor semiconductor die, current typically flows vertically through the semiconductor die between a front-side contact and a backside contact that typically is electrically connected to the package paddle.

High power semiconductor applications, such as power switching and power handling, require electrical connections between the semiconductor die pads and the package leads that are characterized by high current carrying capacity, low resistance, and/or low inductance. For these reasons, efforts have been made to use electrically conductive ribbon or pre-formed clips composed of copper, copper alloy, or aluminum instead of bond wires for high power electrical connections within semiconductor packages. Electrically conductive clips, however, are physically large and difficult to mechanically position on a chip with high accuracy.

In a typical semiconductor power device package, each discrete power transistor semiconductor die is electrically connected to the package with a single front-side high-current package lead, a single front-side low-current package lead for gate control, and a backside connection to the package paddle. With only a single high-current front-side connection per semiconductor die, electrically conductive clips readily can be used for the front-side connections in these types of package arrangements without compromising manufacturability or performance.

Power devices may be implemented using lateral diffusion field effect transistors (LDFETs), such as lateral diffusion metal oxide semiconductor (LDMOS) transistors. These types of transistors are characterized by a "lateral diffusion" region (or low-doped or lightly-doped drain (LDD) region) that corresponds to an extension of the drain region that is less strongly doped than the core drain region and that extends laterally away from the channel. The lateral diffusion region increases an LDFET's ability to handle higher voltages in the off-state by absorbing portions of the electric field that would otherwise cause source-drain punch-through and to handle larger currents in the on-state by preventing a large potential drop from building up at the drain-body interface which would otherwise result in degradation of the device via the injection of hot carriers into the body of the device.

Lateral power devices, such as LDFETs, typically have front-side source and drain contacts, each of which typically has its own high current, low resistance, and/or low inductance front-side electrical connection. The need for both external (e.g., package) and on-chip electrical connections increases with the number of lateral power devices that are integrated on the same semiconductor die. The front-side of a semiconductor die, however, has limited space available to accommodate the relatively large sizes of high performance electrical connections. This limitation severely restricts circuit design flexibility, performance, and manufacturability of integrated lateral power device circuits.

SUMMARY

In some embodiments, a semiconductor device includes an electrically conductive paddle, electrically conductive perimeter package leads, a first electrically conductive clip electrically connected to a first set of the electrically conductive perimeter package leads, a second electrically conductive clip electrically connected to a second set of the electrically conductive perimeter package leads, and a single semiconductor die. In some embodiments, the signal semiconductor die includes a front-side active layer, and the front-side active layer includes an integrated power structure having two or more transistors. The single semiconductor die also includes a backside portion having a backside contact which is electrically coupled to at least one of the two or more transistors and to the electrically conductive paddle. The single semiconductor die includes one or more first front-side contacts electrically coupled to at least one of the two or more transistors and to the first electrically conductive clip. The single semiconductor die additionally includes one or more second front-side contacts electrically coupled to at least one of the two or more transistors and to the second electrically conductive clip.

In some embodiments, a semiconductor device includes an electrically conductive paddle, electrically conductive perimeter package leads, a first electrically conductive clip electrically connected to a first set of the electrically conductive perimeter package leads, a second electrically conductive clip electrically connected to a second set of the electrically conductive perimeter package leads, and a single semiconductor die. In some embodiments, the single semiconductor die includes a front-side active layer, a backside portion having a backside contact electrically connected to the front-side active layer and to the electrically conductive paddle, one or more first front-side contacts electrically connected to the front-side active layer and to the first electrically conductive clip, and one or more second front-side contacts electrically connected to the front-side active layer and to the second electrically conductive clip.

In some embodiments, a method for packaging a semiconductor device in a semiconductor package having a leadframe structure involves providing a leadframe structure having an electrically conductive paddle, and electrically conductive perimeter package leads. A first electrically conductive clip is provided and is electrically connected to a first set of the electrically conductive perimeter package leads. A second electrically conductive clip is provided and is electrically connected to a second set of the electrically conductive perimeter package leads. A semiconductor die is formed. Forming the semiconductor die involves forming a front-side active layer of the semiconductor die, forming a backside contact at a backside portion of the semiconductor die, forming one or more first front-side contacts of the semiconductor die, and forming one or more second front-side contacts of the semiconductor die. The backside contact is electrically connected to the electrically conductive paddle. The first electrically conductive clip is electrically connected to the one or more first front-side contacts. The second electrically conductive clip is electrically connected to the one or more second front-side contacts.

DETAILED DESCRIPTION

In the following description, like reference numbers are used to identify like elements. Furthermore, the drawings are intended to illustrate major features of example embodiments in a diagrammatic manner. The drawings are not intended to depict every feature of actual embodiments nor relative dimensions of the depicted elements, and are not drawn to scale.

Examples that are described herein provide conductive clip arrangements for electrically connecting semiconductor die pads on a semiconductor die to a leadframe structure. Examples of semiconductor dice provided herein include integrated lateral diffusion field effect transistor (LDFET) circuits formed on respective semiconductor dice that respectively include at least one substrate contact to a backside electrical connection that reduces the number of required front-side electrical connections. In this way, these examples increase the front-side space available for accommodating the relatively large sizes of high performance electrical connections for pre-formed electrically conductive clips, thereby increasing circuit design flexibility, performance, and manufacturability of integrated LDFET power device circuits. In some examples, an LDFET that has a substrate contact is electrically isolated from other LDFETs in the same circuit to further improve the performance of the circuit by preventing the formation of a common node between the LDFETs that are connected to the substrate and those that are not.

Figure 1:
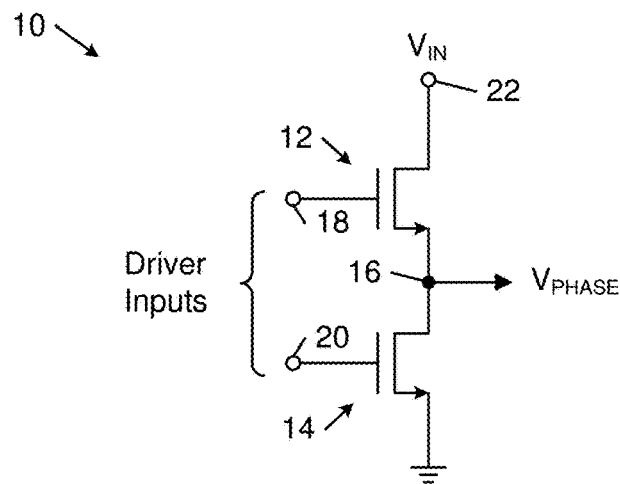
FIG. 1 is a circuit diagram of an example of a high power semiconductor switch incorporating some embodiments.

For illustrative purposes only, this disclosure describes specific examples of single-semiconductor die, integrated LDFET circuits in the context of embodiments similar to the high power semiconductor switch circuit 10 shown in FIG. 1. The same or similar teachings may be used to fabricate other single-semiconductor die integrated LDFET circuits that are suitable for both power and non-power applications.

FIG. 1 shows an example of a high power semiconductor switch circuit 10 that includes a high-side field effect transistor (FET) 12 and a low-side FET 14. The source of the high-side FET 12 is coupled to the drain of the low-side FET 14 at a phase node 16 ($V_{PHASE}$). The driver input terminals 18, 20 control the duty cycles of the high-side FET 12 and the low-side FET 14 to convert the input voltage ($V_{IN}$) at the input node 22 to a particular output voltage ($V_{PHASE}$) at the phase node 16. In general, the FETs 12, 14 may be fabricated using any of a wide variety of semiconductor material systems and technologies, including silicon, germanium, and compound semiconductor technologies.

Figure 2A:
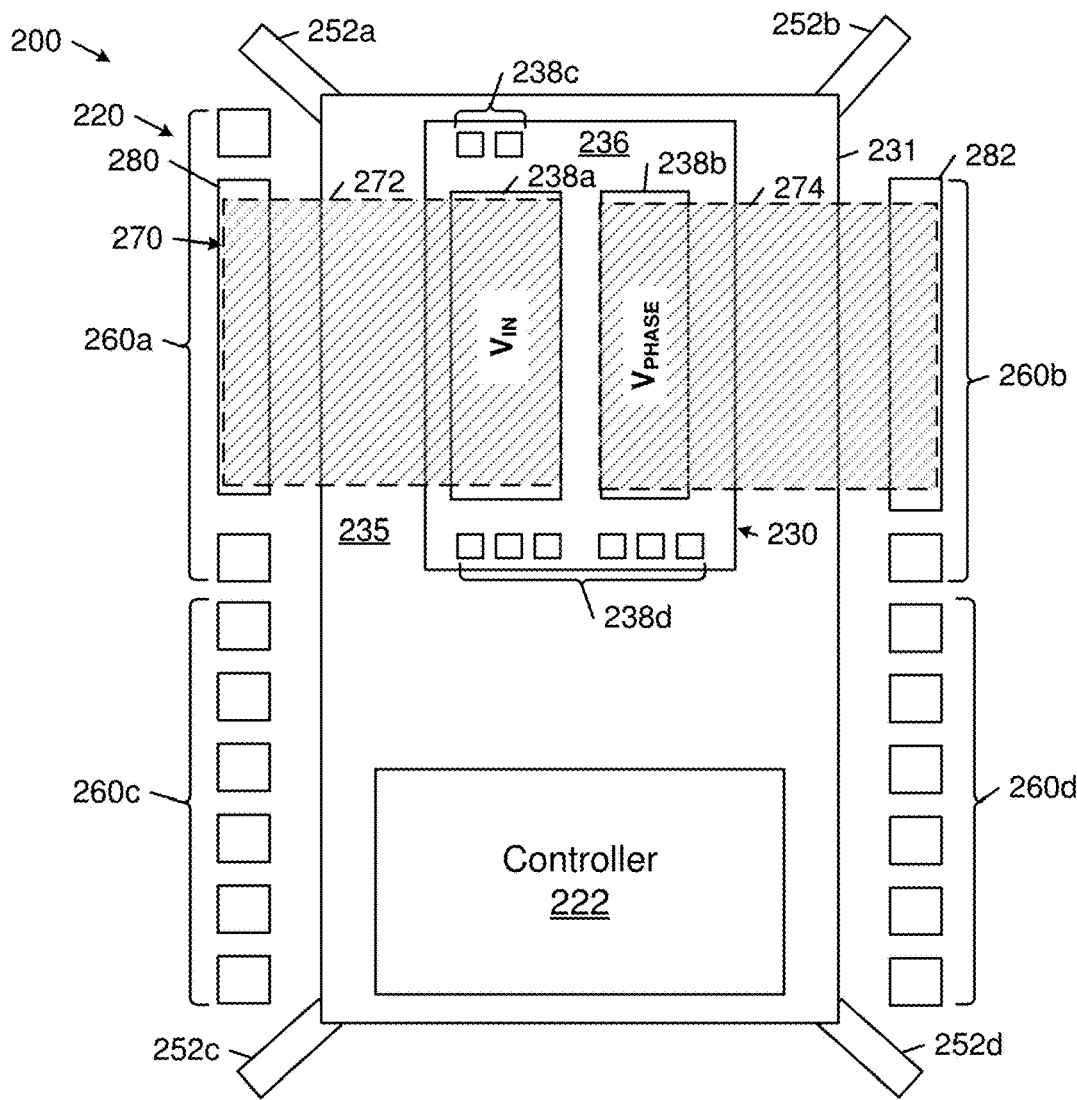
FIG. 2A is a diagrammatic top orthographic view of a simplified example of a portion of an integrated circuit package, in accordance with some embodiments.

FIG. 2A shows a top orthographic view of a simplified example of a portion of an integrated circuit (IC) package 200 including a leadframe structure 220 for a semiconductor device, in accordance with some embodiments. In the example shown, the semiconductor device embodies an integrated power-on-load (POL) voltage converter. However, the semiconductor device could be another semiconductor device as is known in the art.

In general, the leadframe structure 220 includes an electrically conductive paddle ("paddle") 231 (including a rectangular top surface 235); tie bars 252a-d, electrically conductive perimeter package leads 260a-d (including package leads 280 and 282), and a conductive clip arrangement 270 (including a first electrically conductive clip 272 and a second electrically conductive clip 274). The IC package 200 also includes a controller circuit 222 and a semiconductor die 230 (including a top surface 236 and semiconductor die pads 238a-d).

As shown, the first electrically conductive clip 272 is electrically connected to the package lead 280 of the electrically conductive perimeter package leads 260a. The second electrically conductive clip 274 is electrically connected to the package lead 282 of the electrically conductive perimeter package leads 260b. The semiconductor die 230 has a backside portion (shown in FIG. 2C), opposite the top surface 236, which is electrically coupled to the paddle 231. The semiconductor die pad 238a (a first front-side contact of the semiconductor die 230) is electrically coupled to the first electrically conductive clip 272. Additionally, the semiconductor die pad 238b (a second front-side contact of the semiconductor die 230) is electrically coupled to the second electrically conductive clip 274.

In the simplified example shown, the semiconductor die 230 embodies an example implementation of the high power semiconductor switch circuit 10 shown in FIG. 1. The paddle 231 has the rectangular top surface 235 that is bordered by four sides. The semiconductor die 230 is bonded to the paddle 231 by any appropriate technique, such as with a semiconductor die-attach adhesive, a solder paste, or sintered silver. In some examples, a substrate contact of the semiconductor die 230 is electrically coupled to an electrical terminal of the leadframe structure 220 (e.g., one of the perimeter package leads 260a-d) by the paddle 231 itself or by an electrical conductor on or extending through the paddle 231. The semiconductor die 230 includes the top surface 236 on which a number of the semiconductor die pads 238a-d are provided. In the illustrated example, the semiconductor die pads 238a and 238b, respectively, correspond to $V_{IN}$ and $V_{PHASE}$ terminals 22 and 16 of the high power semiconductor switch circuit shown in FIG. 1, the semiconductor die pads 238c correspond to the driver input terminals 18, 20, and the semiconductor die pads 238d correspond to other input/output terminals. In some embodiments, all or a portion of the semiconductor die pads 238c and/or the semiconductor die pads 238d are electrically connected as appropriate to the controller circuit 222 (to receive or send signals, commands and/or feedback for control of the electronic components, e.g., transistors, of the high power semiconductor switch circuit in the semiconductor die 230 described below) or to package leads of the perimeter package leads 260a-d by bond wires. In some embodiments, the four tie bars 252a-d attach the corners of the paddle 231 to a semiconductor package housing (not shown). The controller circuit 222 is also electrically connected to some of the package leads of the perimeter package leads 260a-d, e.g., by bond wires.

The example conductive clip arrangement 270 electrically connects the semiconductor die pad 238a and the semiconductor die pad 238b of the semiconductor die 230 to the leadframe structure 220 using the first electrically conductive clip 272 and the second electrically conductive clip 274, respectively. Conductive clips, such as the first electrically conductive clip 272 and the second electrically conductive clip 274, are often pre-formed (e.g. rather than deposited) using copper (Cu), are mechanically large as compared to a semiconductor die or as compared to bond wires, have greater structural strength compared to bond wires, have greater electrical conductivity capabilities than bond wires, and have greater thermal conductivity capabilities than bond wires. For example, electrically conductive clips typically have a minimum feature size of about 100 µm and a substantial cross sectional area.

As shown, the first electrically conductive clip 272 electrically connects the semiconductor die pad 238a ($V_{IN}$) to the perimeter package lead 280 (of the perimeter package lead set 260a), which corresponds to the terminal 22 in the circuit shown in FIG. 1. The second electrically conductive clip 274 electrically connects the semiconductor die pad 238b ($V_{PHASE}$) to the perimeter package lead 282 (of the perimeter package lead set 260b), which corresponds to the node 16 in the high power semiconductor switch circuit 10 shown in FIG. 1. Advantageously, the two rectangular electrically conductive clips 272, 274 can be mechanically connected across the semiconductor die pads 238a-b to the package leads 280, 282 in a straightforward way while maintaining substantial freedom to optimize the dimensions of the clips to meet desired current carrying capacity, resistance, and/or inductance specifications. The presence of a third front-side conductive clip, however, would impose significant constraints on the ability to optimally arrange the conductive clips on the front-side of the semiconductor die for manufacturability and on the freedom to optimize the current carrying capacity, resistance, and/or inductance properties of the electrically conductive clips.

FIG. 2A is a simplified example and some metal layers, connections, bond-wires, or other features have been omitted. Intervening metal layers, conductive adhesive, or other metal bonding structures may be present.

Figure 2B:
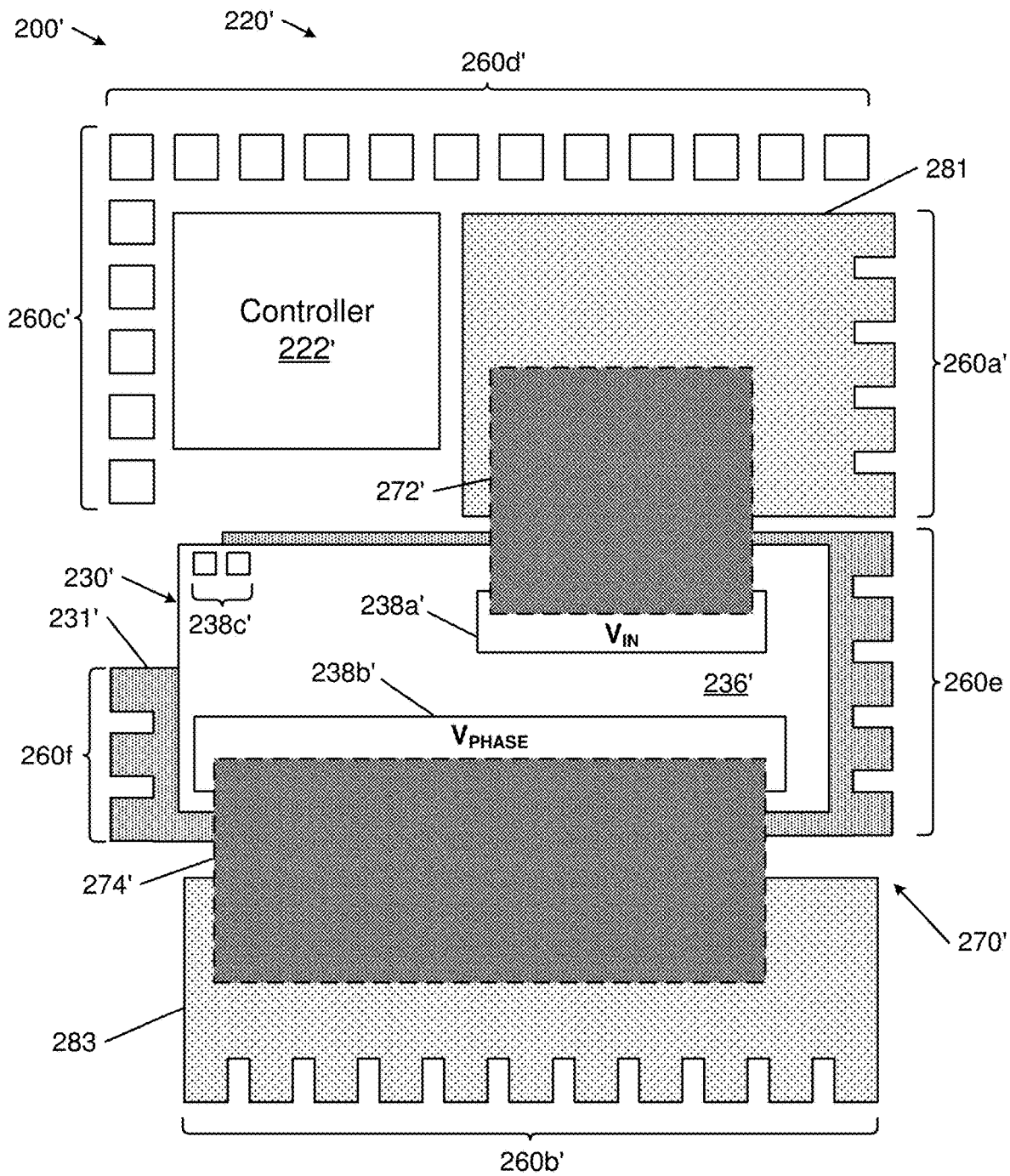
FIG. 2B is a diagrammatic top orthographic view of a simplified example of a portion of an integrated circuit package, in accordance with some embodiments.

FIG. 2B shows a diagrammatic top orthographic view of another simplified example of an integrated circuit (IC) package 200' including a leadframe structure 220' for an integrated power-on-load (POL) voltage converter, in accordance with some embodiments. The leadframe structure 220' generally includes an electrically conductive paddle 231', electrically conductive perimeter package leads 260a'-f' (including a first package lead connection portion 281 and a second package lead connection portion 283), and a conductive clip arrangement 270' (including a first electrically conductive clip 272' and a second electrically conductive clip 274'). The IC package 200' also includes a controller circuit 222' and a semiconductor die 230' (having a topside portion 236' and semiconductor die pads 238a'-c').

Elements of the leadframe structure 220' shown in FIG. 2B function in similar ways as corresponding elements of the leadframe structure 220 shown in FIG. 2A. In this regard, the functionally similar elements of the leadframe structure 220' of FIG. 2B are labeled with the reference numbers of the corresponding elements of the leadframe structure 220 of FIG. 2A with a prime (') designation. For example, the electrically conductive clip 274' of FIG. 2B corresponds to the functionally similar electrically conductive clip 274 of FIG. 2A.

The conductive clip arrangement 270' of FIG. 2B electrically connects the semiconductor die pad 238a' and the semiconductor die pad 238b' of the semiconductor die 230' to the leadframe structure 220' using the first electrically conductive clip 272' and the second electrically conductive clip 274'. As shown, the first electrically conductive clip 272' is electrically connected to the first package lead portion 281 of the electrically conductive perimeter package leads 260a' and is thereby electrically connected to the electrically conductive perimeter package leads 260a'. The second electrically conductive clip 274' is electrically connected to the second package lead connection portion 283 of the electrically conductive perimeter package leads 260b' and is thereby electrically connected to the electrically conductive perimeter package leads 260b'. The semiconductor die 230' has a backside portion (shown in FIG. 2C), opposite the top surface 236', which is electrically coupled to the electrically conductive paddle 231'. The semiconductor die pad 238a' (a first front-side contact of the semiconductor die 230' on the top surface 236') is electrically coupled to the first electrically conductive clip 272'. Additionally, the semiconductor die pad 238b' (a second front-side contact of the semiconductor die 230' on the top surface 236') is electrically coupled to the second electrically conductive clip 274'.

In some embodiments, a backside contact of the backside portion of the semiconductor die 230' is electrically coupled to the electrically conductive paddle 231' by a semiconductor die-attach adhesive or by another material, such as a solder paste or sintered silver. The electrically conductive paddle 231' is either part of, or is electrically connected to, the perimeter package leads 260e-f. In some embodiments, a substrate contact of the semiconductor die 230' may be electrically coupled to an electrical terminal of the leadframe structure 220' by the paddle 231' itself or by an electrical conductor on or extending through the paddle 231'.

As will be discussed with reference to later figures, in some embodiments the semiconductor die 230' includes an integrated power structure having two or more transistors. In some embodiments, the integrated power structure is the high power semiconductor switch circuit 10 shown in FIG. 1 and the two or more transistors include the high-side FET 12 and the low-side FET 14. The semiconductor die 230' has front-side contacts that include the semiconductor die pads 238a'-c'. The semiconductor die pads 238a'-c' are respectively electrically coupled to at least one of the two or more transistors of the semiconductor die 230'. In the illustrated example, the semiconductor die pads 238a' and 238b', respectively, correspond to $V_{IN}$ and $V_{PHASE}$ terminals 22 and 16 of the high power semiconductor switch circuit shown in FIG. 1, and the semiconductor die pads 238c' (on the top surface 236') correspond to the driver input terminals 18, 20. In some embodiments, all or a portion of the semiconductor die pads 238c' are electrically coupled to the controller circuit 222' or to package leads of the perimeter package leads 260c'-d' by bond wires.

Some metal layers, connections, bond-wires, or other features have been omitted for simplicity. Intervening metal layers, conductive adhesive, or other metal bonding structures may be present.

Figure 2C:
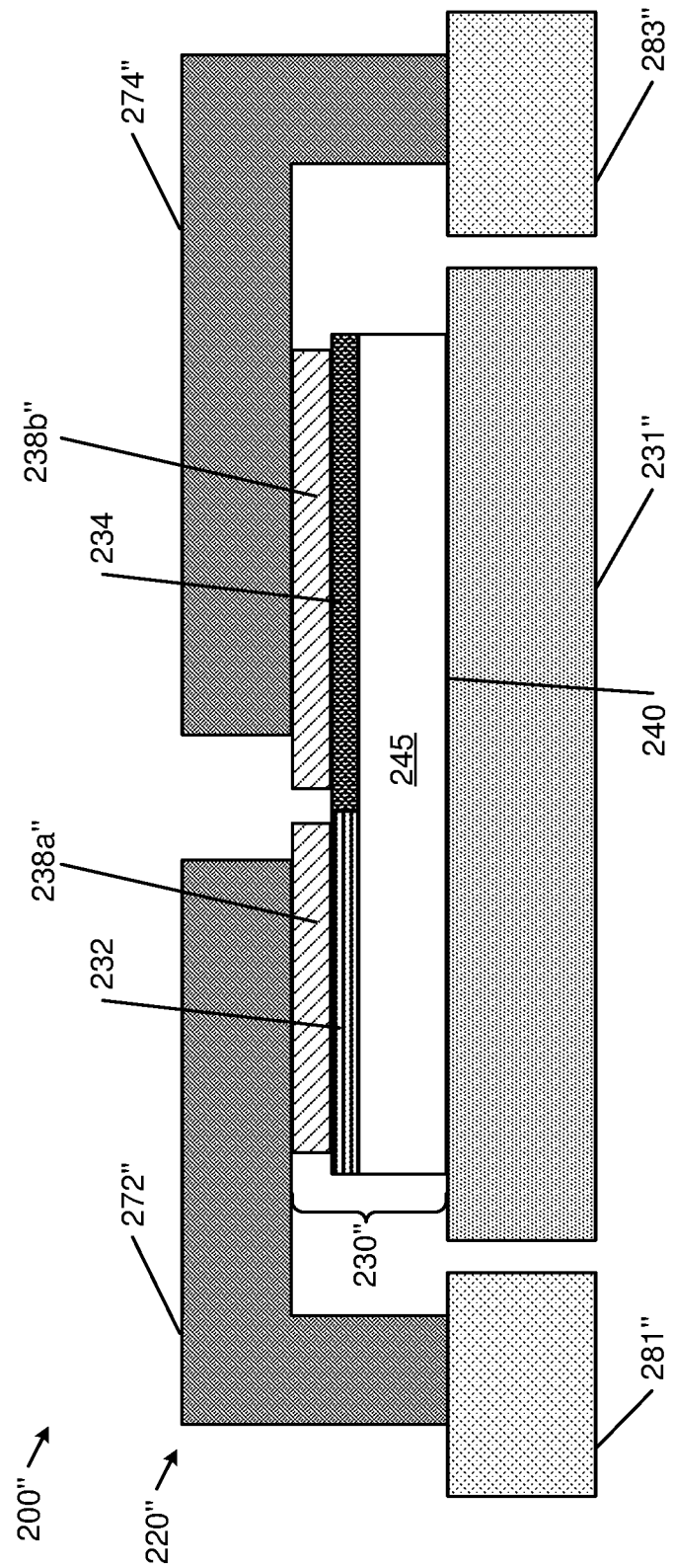
FIG. 2C is a cross-section of a simplified example of a portion of an integrated circuit package, in accordance with some embodiments.

FIG. 2C shows a diagrammatic cross-section view of a portion of a simplified example integrated circuit (IC) package 200" including a leadframe structure 220" for an integrated power-on-load (POL) voltage converter, in accordance with some embodiments. The portion of the leadframe structure 220" shown generally includes an electrically conductive paddle 231", a first electrically conductive clip 272", a second electrically conductive clip 274", a first package lead connection portion 281", and a second package lead connection portion 283". The IC package 200" also includes a semiconductor die 230". In the simplified example shown, the semiconductor die 230" generally includes a front-side active layer having a high-side FET 232 and a low-side FET 234, semiconductor die pads 238a"-b", a substrate contact 240, and a substrate 245.

The first electrically conductive clip 272" is electrically connected to the first package lead connection portion 281", and is thereby electrically connected to a first set of electrically conductive package leads (as shown in FIG. 2B) similar to the electrically conductive perimeter package leads 260a' of FIG. 2B. The second electrically conductive clip 274" is electrically connected to the second package lead connection portion 283", and is thereby electrically connected to a second set of electrically conductive package leads (as shown in FIG. 2B) similar to the electrically conductive perimeter package leads 260b' of FIG. 2B.

The substrate contact 240 is electrically coupled to the high-side FET 232 and/or the low-side FET 234. The semiconductor die pad 238a" is electrically coupled to the high-side FET 232 and to the first electrically conductive clip 272". The semiconductor die pad 238b" is electrically coupled to the low-side FET 234 and to the second electrically conductive clip 274". The substrate contact 240 is electrically coupled to the electrically conductive paddle 231".

The semiconductor die pads 238a"-b" generally represent top metal layers of multiple metal layers. Additional metal layers of the multiple metal layers between the semiconductor die pads 238a"-b" and the FETs 232 and 234 are not shown for simplicity. The various metal layers route connections as needed between and among the FETs 232 and 234 and the semiconductor die pads 238a"-b", as well as with additional semiconductor die pads not shown. Some metal layers, connections, bond-wires, or other features have been omitted for simplicity. Intervening metal layers, conductive adhesive, or other metal bonding structures may be present.

Figure 3:
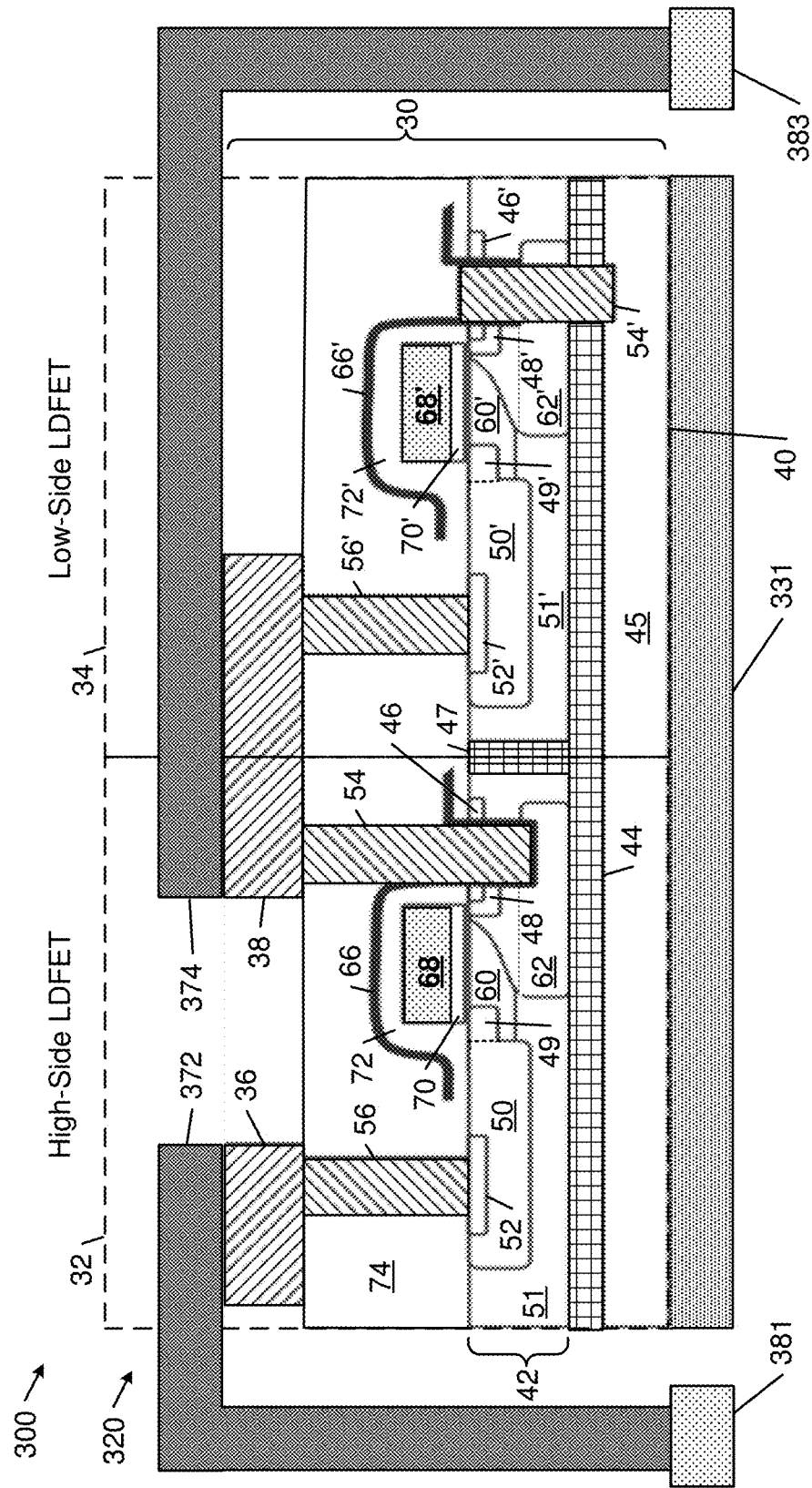
FIG. 3 is a diagrammatic cross-section of a simplified example of a portion of an integrated circuit package, in accordance with some embodiments.

FIG. 3 shows a simplified diagrammatic cross-sectional side view of a portion of an integrated circuit (IC) package 300 including a leadframe structure 320, in accordance with some embodiments. The portion of the leadframe structure 320 shown generally includes an electrically conductive paddle 331, a first electrically conductive clip 372, a second electrically conductive clip 374, a first package lead connection portion 381, and a second package lead connection portion 383. The IC package 300 also includes a semiconductor die 30. Portions of the leadframe structure 320 are similar to portions of the leadframe structures 220/220'/220" discussed with reference to FIGS. 2A-C. For example: the electrically conductive paddle 331 is similar to the electrically conductive paddle 231/231'/231"; the first electrically conductive clip 372 is similar to the first electrically conductive clip 272/272'/272"; the second electrically conductive clip 374 is similar to the second electrically conductive clip 274/274'/274"; the first package lead connection portion 381 is similar to the first package lead connection portion 281/281"; and the second package lead connection portion 383 is similar to the second package lead connection portion 283/283".

In the simplified example embodiment shown, the semiconductor die 30 embodies the high power semiconductor switch circuit 10 of FIG. 1. In this example, a LDFET 32 implements the high-side FET 12 of the switch circuit 10, and a LDFET 34 implements the low-side FET 14 of the switch circuit 10. In one example configuration, an input contact 36 of the high-side LDFET 32 corresponds to the input node 22 of the switch circuit 10, a phase contact 38 corresponds to the phase node 16 of the switch circuit 10, and a substrate contact 40 corresponds to the ground node of the switch circuit 10.

In the example implementation of the high power semiconductor switch circuit 10 described above and shown in FIG. 3, the drain contact 56 of the high-side LDFET 32 is connected to the input node 22, the source contact 54 of the high-side LDFET 32 and the drain contact 56' of the low-side LDFET 34 are both connected to the phase node 16, and the source contact 54' of the low-side LDFET 34 is connected to the ground node. As mentioned above, other node connection arrangements are possible. For example, these other connection arrangements include any connection arrangements between a first LDFET and a second LDFET that includes (i) a common node that electrically connects to a source of a first LDFET and a drain of a second LDFET, (ii) at least one of the drain of the first LDFET, the source of the second LDFET, and the common node is electrically connected to the semiconductor substrate, and (iii) first and second front-side contacts that are respectively connected to the ones of the drain of the first LDFET, the source of the second LDFET, and the common node that are not electrically connected to the semiconductor substrate.

The high-side and low-side LDFETs 32, 34 are implemented in an active layer 42. The active layer 42 can be any of a doped portion of the bulk of a semiconductor wafer, a localized well formed in a larger doped portion of a semiconductor wafer, an active layer of a semiconductor-on-insulator (SOI) wafer, and a localized well formed in an SOI wafer. In the illustrated example, the active layer 42 is a thin film formed over a buried dielectric layer 44 of an SOI substrate 45. In the illustrated example, a dielectric isolation barrier 47 extends between the high-side and low-side LDFETs 32, 34 from the top of the active layer 42 to the buried dielectric layer 44. In some examples, the dielectric isolation barrier 47 is formed using a shallow trench isolation (STI) process.

The high-side LDFET 32 portion of the active layer 42 includes a source region 46 formed in a doped region 48, a lightly doped drain (LDD) region 50 with a heavier doped extension region 49 that are formed in a doped region 51, and drain region 52. The source region 46, the doped region 48, the LDD region 50, the extension region 49, and the drain region 52 can comprise doped semiconductor material formed by, for example, the implant of impurities into active layer 42. The doped semiconductor material of each region 46-52 has a similar conductivity type (e.g., n-type or p-type). Therefore, each region 46-52 can be formed by the same dopant species, such as through the implant of one kind of dopant atom. The LDD region 50 has a lower dopant concentration than the drain region 52 and may also have a lower dopant concentration than the source region 46. The LDD region 50 provides the LDFET with its superior performance as a power device in terms of its ability to hold off large voltages and not degrade while sinking large currents. The presence of LDD region 50 provides the LDFET with its characteristic of having asymmetric source and drain regions. In some approaches, LDD region 50 generally extends laterally at least twice as far from the drain region 52 as the doped region 48 extends from the source region 46.

The high-side LDFET portion of the active layer 42 also includes a body region 60 and a deep well region 62 that have a conductivity type that is opposite the conductivity type of the source, doped, LDD, extension, and drain regions 46-52. The deep well region 62 extends laterally underneath the source region 46 and the portion of body region 60 in which a channel forms. The deep well region 62 enhances the ability of the high-side LDFET 32 to withstand large voltages and serves to remove unwanted charge carriers from body region 60 to prevent a parasitic bipolar junction transistor from activating during the on state of the high-side LDFET 32.

Above the active layer 42, the high-side LDFET 32 includes a gate structure that includes a gate shield 66 and a gate electrode 68. The gate electrode 68 is electrically insulated from the active layer 42 and the gate shield 66 by dielectric material 70, 72, respectively. Source region 46 is electrically coupled to a source contact 54 that is connected to the phase contact 38. Drain region 52 is electrically coupled to a drain contact 56 that is connected to the input contact 36. Drain region 52 can be a highly doped drain region and can form an electrically conductive path between drain contact 56 and LDD region 50. Electrically insulating material 74 (e.g., an interlayer dielectric) electrically isolates the electrical components above the active layer 42. In general, the electrically insulating material 74 and the dielectric material 70, 72 may be the same or similar materials. In addition, in certain approaches, the combination of insulating material 74 and dielectric material 70, 72 can be conceptualized as a single insulating layer in the finished device regardless of when and how they are formed.

A conductive path is formed between source contact 54 and drain contact 56 in response to the application of a voltage to gate electrode 68. The conductive path between source contact 54 and drain contact 56 includes a channel that is selectively formed in body region 60 under the influence of the aforementioned voltage applied to gate electrode 68. While the channel is formed, the transistor is said to be on. While the channel is not formed, and there is no conductive path between source contact 54 and drain contact 56, the transistor is said to be off. There is no conductive path in this situation because source region 46 and drain regions 50, 52 have an opposite conductivity type to body region 60 such that diode junctions are formed at their interfaces.

The gate shield 66 is in ohmic contact with the source contact 54. The gate shield 66 is another feature that makes the high-side FET 32 more amenable to high power applications. By biasing the gate shield 66 to a given voltage, high power signals on drain contact 56 are shielded from having an appreciable effect on the gate region. Although the gate shield 66 is illustrated as being ohmically coupled to the source contact 54, the gate shield 66 can also be independently biased. In some examples, the gate shield 66 and the source contact 54 can be formed in two different steps and can comprise two different kinds of material. In this case, however, such features are inconsequential to the operation of the device in most situations because the gate shield 66 and the source contact 54 are one contiguous region of highly conductive material with an uninterrupted ohmic contact from above dielectric material 74 all the way to the surface of active layer 42. As such, the combination of the gate shield 66 and the source contact 54 can be conceptualized as a single source contact.

In general, the source contact 54 and the drain contact 56 enable electrical connections to the high-side LDFET 32 from other circuitry that may or may not be integrated with the LDFET on the same integrated circuit. Source region 46 can be electrically coupled to source contact 54 via a silicide layer formed on the surface of source region 46. More generally, the source region 46 can be coupled to the source contact 54 using any process that forms an ohmic or non-rectifying contact between the two regions of the structure. The connection between the drain contact 56 and the drain region 52 can comprise any of the variations described above with reference to source contact 54 and source region 46. The source contact 54 and the drain contact 56 can comprise a metal, metal alloy, metal silicide, or an electrically conductive semiconductor material such as doped polysilicon. Example metals, metal alloys, and metal silicides can each comprise copper, tungsten, molybdenum, and aluminum.

In the example shown in FIG. 3, some of the elements of the low-side LDFET portion 34 of the active layer 42 function in similar ways as the corresponding elements of the high-side LDFET portion 32 of the active layer 42. In this regard, the functionally similar elements of the low-side LDFET 34 will be labeled with reference numbers of the corresponding elements of the high-side LDFET that are followed by an apostrophe. For example, the drain region of the low-side LDFET 34 that corresponds to the functionally similar drain region 52 of the high-side LDFET 32 is labeled with reference number 52'. Thus, the low-side LDFET 34 includes the following elements: source region 46', doped region 48', LDD region 50' with a heavier doped extension region 49' that are formed in a doped region 51', drain region 52', source contact 54', drain contact 56', body region 60', deep well region 62', gate shield 66', gate electrode 68', and dielectric material 70', 72'.

In this example, the source contact 54' of the low-side LDFET 34 not only extends from above the active layer 42, through the source and doped regions 46', 48' to the deep well region 62', but it also extends through the deep well region 62' and the buried dielectric layer 44 and into the substrate 45. In this way, the source contact 54' of the low-side LDFET 34 provides a source-down electrical connection to the substrate 45 and thereby to the substrate contact 40, which corresponds to the ground node for the high power semiconductor switch circuit 10.

The phase node contact 38 electrically interconnects the source contact 54 of the high-side LDFET with the drain contact 56' of the low-side LDFET and, thereby, forms a common node for the source region 46 of the high-side LDFET 32 and the drain region 52' of the low-side LDFET 34. It is noted that the buried dielectric layer 44 and the dielectric isolation barrier 47 electrically isolate the high-side LDFET 32 from the substrate 45 to prevent the formation of a common node with the source contact 54' of the low-side LDFET 34 during operation of the power switch circuit 10.

As shown, the first electrically conductive clip 372 is electrically coupled to the input contact 36 and the second electrically conductive clip 374 is electrically coupled to the phase node contact 38. The substrate contact 40 is electrically coupled to the electrically conductive paddle 331. The first electrically conductive clip 372 is electrically connected to the first package lead connection portion 381 and thereby electrically connected to a first set of electrically conductive package leads (not shown) which are similar to the electrically conductive perimeter package leads 260a' of FIG. 2B. The second electrically conductive clip 374 is electrically connected to the second package lead connection portion 383 and is thereby electrically connected to a second set of electrically conductive package leads (not shown) which are similar to the electrically conductive perimeter package leads 260b' of FIG. 2B.

As mentioned above, reconfiguring one of the three front-side source, drain, and phase node contacts in a conventional implementation of the power switch circuit 10 as a substrate contact frees up physical space on the front-side of the semiconductor die for high performance electrical connections to the two remaining front-side contacts. This feature increases circuit design flexibility, performance, and manufacturability of integrated lateral power device circuits.

Metal layers (e.g., the contacts 36 and 38) shown in FIG. 3 generally represent multiple metal layers that route connections as needed, including top metal layers for semiconductor die pads (e.g., similar to 238a-d, 238a'-c', and 238a"-b") and additional metal layers between the semiconductor die pads and the insulating material (e.g., 74) or the active layer (e.g., 42). Some metal layers, connections, bond-wires, or other features have been omitted for simplicity. Intervening metal layers, conductive adhesive, or other metal bonding structures may be present. The simplified diagrammatic cross-sectional side view shows only a single transistor "finger" for simplicity. In some embodiments, as discussed with reference to FIG. 17, multiple transistor fingers are connected in parallel to increase the power handling capability of the embodied circuit and to reduce total resistance as required by the application of the embodied circuit.

Figure 4:
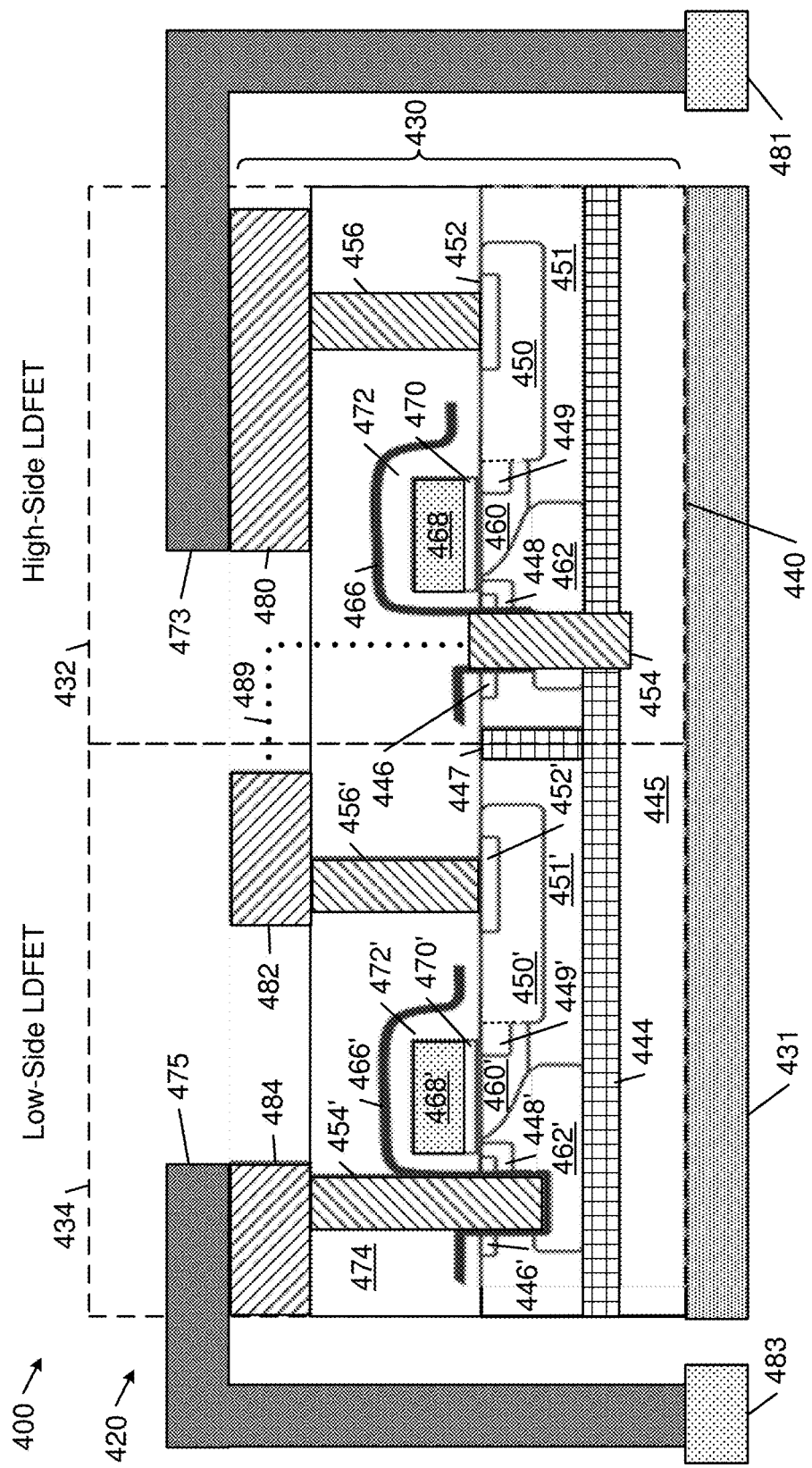
FIG. 4 is a diagrammatic cross-sectional side view of a simplified example of a portion of an integrated circuit package, in accordance with some embodiments.

FIG. 4 shows a simplified diagrammatic cross-sectional side view of a portion an integrated circuit (IC) package 400 including of a leadframe structure 420. The portion of the leadframe structure 420 shown generally includes an electrically conductive paddle 431, a first electrically conductive clip 473, a second electrically conductive clip 475, a first package lead connection portion 481, and a second package lead connection portion 483. The IC package 400 also includes a semiconductor die 430. Portions of the leadframe structure 420 are structurally similar to portions of the leadframe structures 220/220'/220" discussed with reference to FIGS. 2A-C. For example: the electrically conductive paddle 431 is similar to the electrically conductive paddle 231/231'/231"; the first electrically conductive clip 473 is similar to the first electrically conductive clip 272/272'/272"; the second electrically conductive clip 475 is similar to the second electrically conductive clip 274/274'/274"; the first package lead connection portion 481 is similar to the first package lead connection portion 281/281"; and the second package lead connection portion 483 is similar to the second package lead connection portion 283/283".

In the example embodiment shown, the semiconductor die 430 embodies the high power semiconductor switch circuit 10 of FIG. 1. In one example configuration, a first front-side contact 480 of the high-side LDFET 432 corresponds to the input node 22 of the switch circuit 10 (see FIG. 1), a substrate contact 440 corresponds to the phase node 16 of the switch circuit 10, and a second front-side contact 484 corresponds to the ground node of the switch circuit 10.

Some of the elements of the high-side LDFET 32 of the semiconductor die 30 shown in FIG. 3 function in similar ways as the corresponding elements of the high-side LDFET 432 shown in FIG. 4. In this regard, the functionally similar elements of the high-side LDFET 432 of FIG. 4 are labeled with the reference numbers of the corresponding elements of the high-side LDFET of FIG. 3 preceded by the number "4". For example, the drain region of the high-side LDFET 432 of FIG. 4 that corresponds to the functionally similar drain region 52 of the high-side LDFET 32 of FIG. 3 is labeled with reference number "452". Thus, the high-side LDFET 432 includes the following elements: source region 446, doped region 448, LDD region 450 with a heavier doped extension region 449 that are formed in a doped region 451, drain region 452, source contact 454, drain contact 456, body region 460, deep well region 462, gate shield 466, gate electrode 468, dielectric material 470, 472 and insulating material 474. In addition, the functionally similar elements of the low-side LDFET 434 are labeled with the reference numbers of the corresponding elements of the high-side LDFET 432 followed by an apostrophe. Thus, the low-side LDFET 434 includes the following elements: source region 446', doped region 448', LDD region 450' with a heavier doped extension region 449' that are formed in a doped region 451', drain region 452', source contact 454', drain contact 456', body region 460', deep well region 462', gate shield 466', gate electrode 468', and dielectric material 470', 472'.

In this example, the drain contact 456' of the low-side LDFET 434 and the source contact 454 of the high-side LDFET 432 are electrically connected by an electrical conductor 482 that includes an out-of-plane portion 489. In addition, the source contact 454 of the high-side LDFET 432 not only extends from above the active layer, through the source and doped regions 446, 448 to the deep well region 462, but it also extends through the deep well region 462 and the buried dielectric layer 444 and into the wafer substrate 445. In this way, the source contact 454 of the high-side LDFET 432 provides a source-down electrical connection to the substrate 445 and thereby to the substrate contact 440 for the phase node 16 of the high power semiconductor switch circuit 10. It is noted that the buried dielectric layer 444 and the dielectric isolation barrier 447 electrically isolate the low-side LDFET 434 from the substrate 445 to prevent the formation of a common node with the source contact 454 of the high-side LDFET 432 during operation of the power switch circuit.

As shown, the first electrically conductive clip 473 is electrically coupled to the first front-side contact 480 and the second electrically conductive clip 475 is electrically coupled to the second front-side contact 484. The substrate contact 440 is electrically coupled to the electrically conductive paddle 431. The first electrically conductive clip 473 is electrically connected to the first package lead connection portion 481 and thereby electrically connected to a first set of electrically conductive package leads (not shown) which are similar to the electrically conductive perimeter package leads 260a' of FIG. 2B. The second electrically conductive clip 475 is electrically connected to the second package lead connection portion 483 and is thereby electrically connected to a second set of electrically conductive package leads (not shown) which are similar to the electrically conductive perimeter package leads 260b' of FIG. 2B.

Metal layers (e.g., contacts and electrical conductors 480, 482 and 484) shown in FIG. 4 generally represent multiple metal layers that route connections as needed, including top metal layers for semiconductor die pads (e.g., similar to 238a-d, 238a'-c', and 238a"-b") and additional metal layers between the semiconductor die pads and the insulating material or the active layer as mentioned above for the metal layers in other embodiments. Some metal layers, connections, bond-wires, or other features have been omitted for simplicity. Intervening metal layers, conductive adhesive, or other metal bonding structures may be present. The simplified diagrammatic cross-sectional side view shows only a single transistor "finger" for simplicity. In some embodiments, as discussed with reference to FIG. 17, multiple transistor fingers are connected in parallel to increase the power handling capability of the embodied circuit and to reduce total resistance as required by the application of the embodied circuit.

Figure 5:
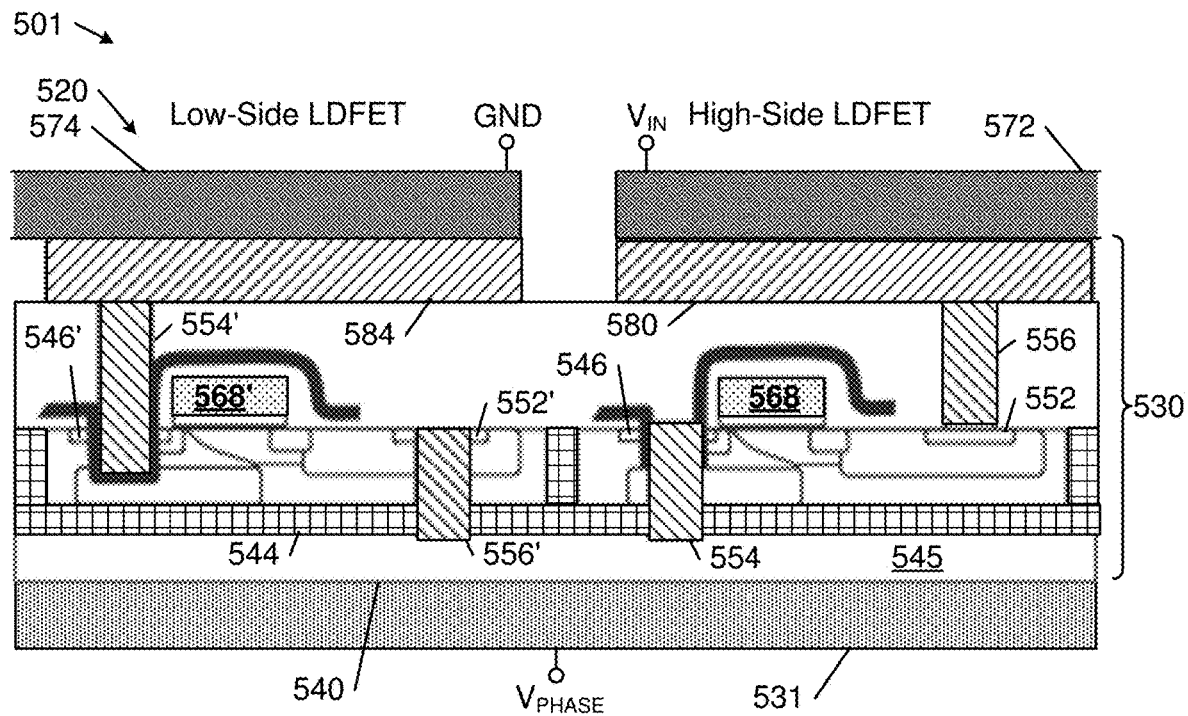
FIG. 5 is a diagrammatic cross-sectional side view of a simplified example of a portion of an integrated circuit package, in accordance with some embodiments.

FIG. 5 shows a simplified diagrammatic cross-sectional side view of a portion of an integrated circuit (IC) package 501 including a leadframe structure 520, in accordance with some embodiments. The portion of the leadframe structure 520 shown generally includes an electrically conductive paddle 531, a first electrically conductive clip 572, and a second electrically conductive clip 574. The IC package 501 also includes a semiconductor die 530. Portions of the leadframe structure 520 are similar to portions of the leadframe structures 220/220'/220" discussed with reference to FIGS. 2A-C. For example: the electrically conductive paddle 531 is similar to the electrically conductive paddle 231/231'/231"; the first electrically conductive clip 572 is similar to the first electrically conductive clip 272/272'/272"; and the second electrically conductive clip 574 is similar to the second electrically conductive clip 274/274'/274".

For simplicity, only portions of the first electrically conductive clip 572 and the second electrically conductive clip 574 are shown in FIG. 5. It is to be understood that these portions are each part of respective electrically conductive clip structures that are similar to the electrically conductive clip structures 272" and 274". Thus, the first electrically conductive clip 572 is electrically connected to a first package lead connection portion (not shown) that is similar to the first package lead connection portion 281/281". Similarly, the second electrically conductive clip 574 is electrically connected to a second package lead connection portion (not shown) that is similar to the second package lead connection portion 283/283".

In the example embodiment shown, the semiconductor die 530 embodies the high power semiconductor switch circuit 10 of FIG. 1. In one example, a first front-side contact 580 of the high-side LDFET is connected to the input node ($V_{IN}$) of the switch circuit 10 (see FIG. 1), a substrate contact 540 is connected to the phase node 16 ($V_{PHASE}$) of the switch circuit 10, a second front-side contact 584 is connected to the ground node (GND) of the switch circuit 10. The substrate contact 540 corresponds to the phase node of the switch circuit 10.

In this example, some of the elements of the high-side LDFET 32 of the semiconductor die 30 shown in FIG. 3 function in similar ways as the corresponding elements of the high-side LDFET shown in FIG. 5. In this regard, the functionally similar elements of the high-side LDFET of FIG. 5 are labeled with the reference numbers of the corresponding elements of the high-side LDFET of FIG. 3 preceded by the number "5". For example, the drain region of the high-side LDFET of FIG. 5 that corresponds to the functionally similar drain region 52 of the high-side LDFET 32 of FIG. 3 is labeled with reference number "552". Thus, the high-side LDFET includes the following elements: source region 546, drain region 552, source contact 554, drain contact 556, and gate electrode 568. In addition, the functionally similar elements of the low-side LDFET are labeled with the reference numbers of the corresponding elements of the high-side LDFET followed by an apostrophe. Thus, the low-side LDFET shown in FIG. 5 includes the following elements: source region 546', drain region 552', source contact 554', drain contact 556', and gate electrode 568'.

In this example, using a process that supports formation of both source and drain substrate contacts, both the high-side source contact 554 and low-side drain contact 556' are fabricated as substrate contacts that extend through the buried dielectric layer 544 to the substrate 545. Thus, instead of using a front-side contact to connect the high-side source region 546 to the low-side drain region 552' as in the example shown in FIG. 4, this implementation of the high power semiconductor switch circuit 10 uses two substrate contacts 554 and 556' to connect the high-side source region 546 and the low-side drain region 552' to the phase node ($V_{PHASE}$). In this way, the number of front-side connections is reduced from three to two.

As shown, the first electrically conductive clip 572 is electrically coupled to the first front-side contact 580 and the second electrically conductive clip 574 is electrically coupled to the second front-side contact 584. The substrate contact 540 is electrically coupled to the electrically conductive paddle 531. The first electrically conductive clip 572 is electrically connected to the first package lead connection portion (not shown) and thereby electrically connected to a first set of electrically conductive package leads (not shown) which are similar to the electrically conductive perimeter package leads 260a' of FIG. 2B. The second electrically conductive clip 574 is electrically connected to the second package lead connection portion (not shown) and is thereby electrically connected to a second set of electrically conductive package leads (not shown) which are similar to the electrically conductive perimeter package leads 260b' of FIG. 2B.

Metal layers (e.g., the contacts 580 and 584) shown in FIG. 5 generally represent multiple metal layers that route connections as needed, including top metal layers for semiconductor die pads (e.g., similar to 238a-d, 238a'-c', and 238a"-b") and additional metal layers between the semiconductor die pads and the insulating material or the active layer as mentioned above for the metal layers in other embodiments. Some metal layers, connections, bond-wires, or other features have been omitted for simplicity. Intervening metal layers, conductive adhesive, or other metal bonding structures may be present. The simplified diagrammatic cross-sectional side view shows only a single transistor "finger" for simplicity. In some embodiments, as discussed with reference to FIG. 17, multiple transistor fingers are connected in parallel to increase the power handling capability of the embodied circuit and to reduce total resistance as required by the application of the embodied circuit.

Figure 6:
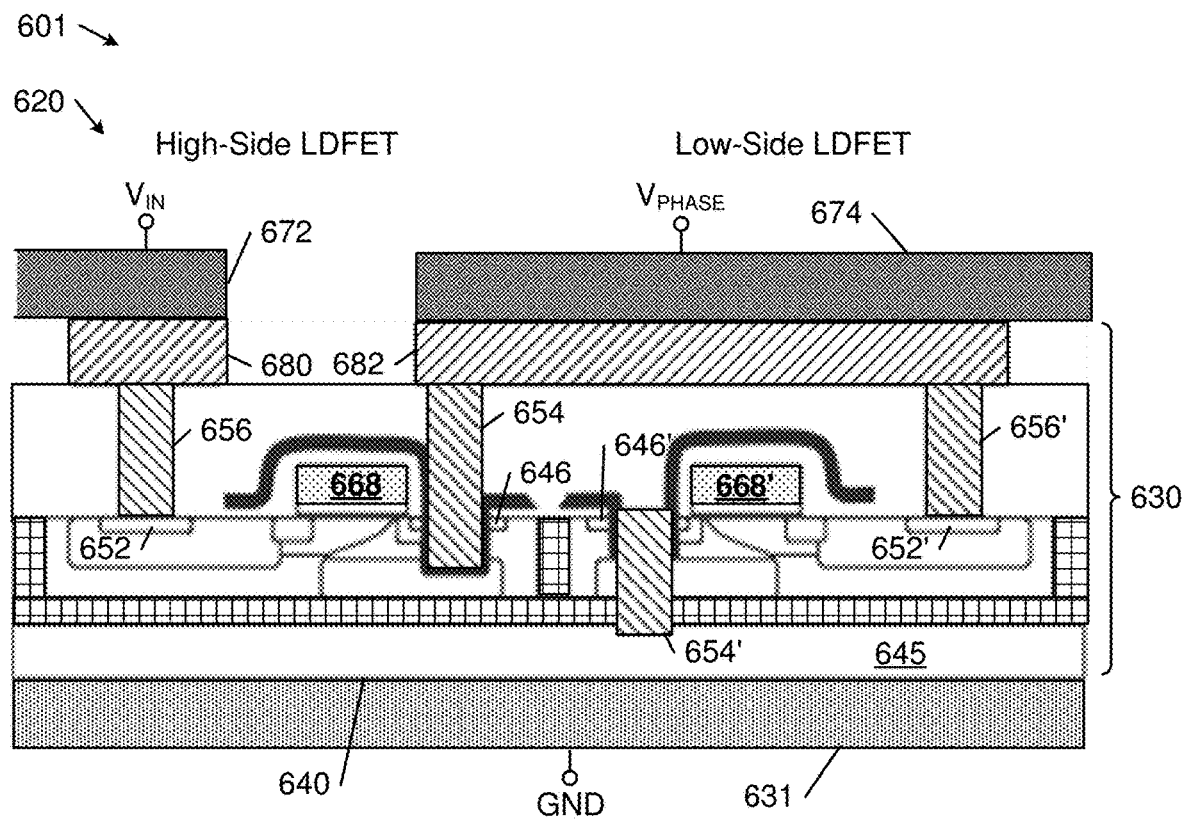
FIG. 6 is a diagrammatic cross-sectional side view of a simplified example of a portion of an integrated circuit package, in accordance with some embodiments.

FIG. 6 shows a simplified diagrammatic cross-sectional side view of a portion of an integrated circuit (IC) package 601 including a leadframe structure 620, in accordance with some embodiments. The portion of the leadframe structure 620 shown generally includes an electrically conductive paddle 631, a first electrically conductive clip 672, and a second electrically conductive clip 674. The IC package 601 also includes a semiconductor die 630. Portions of the leadframe structure 620 are similar to portions of the leadframe structures 220/220'/220" discussed with reference to FIGS. 2A-C. For example: the electrically conductive paddle 631 is similar to the electrically conductive paddle 231/231'/231"; the first electrically conductive clip 672 is similar to the first electrically conductive clip 272/272'/272"; and the second electrically conductive clip 674 is similar to the second electrically conductive clip 274/274'/274".

For simplicity, only portions of the first electrically conductive clip 672 and the second electrically conductive clip 674 are shown in FIG. 6. It is to be understood that these portions are each part of respective electrically conductive clip structures that are similar to the electrically conductive clip structures 272" and 274". Thus, the first electrically conductive clip 672 is electrically connected to a first package lead connection portion (not shown) that is similar to the first package lead connection portion 281/281". Similarly, the second electrically conductive clip 674 is electrically connected to a second package lead connection portion (not shown) that is similar to the second package lead connection portion 283/283".

In the example embodiment shown, the semiconductor die 630 embodies the high power semiconductor switch circuit 10 of FIG. 1. In one example configuration, a first front-side contact 680 of the high-side LDFET is connected to the input node ($V_{IN}$) of the switch circuit 10 (see FIG. 1), a second front-side contact 682 is connected to the phase node ($V_{PHASE}$) of the switch circuit 10, and a source contact 654', contacting substrate 645, is connected by the electrically conductive paddle 631 through a backside contact 640 to the ground node (GND) of the switch circuit 10.

Some of the elements of the high-side LDFET 32 of the semiconductor die 30 shown in FIG. 3 function in similar ways as the corresponding elements of the high-side LDFET shown in FIG. 6. In this regard, the functionally similar elements of the high-side LDFET of FIG. 6 are labeled with the reference numbers of the corresponding elements of the high-side LDFET of FIG. 3 preceded by the number "6". For example, the drain region of the high-side LDFET of FIG. 6 that corresponds to the functionally similar drain region 52 of the high-side LDFET 32 of FIG. 3 is labeled with reference number "652". Thus, the high-side LDFET includes the following elements: source region 646, drain region 652, source contact 654, drain contact 656, and gate electrode 668. In addition, the functionally similar elements of the low-side LDFET are labeled with the reference numbers of the corresponding elements of the high-side LDFET followed by an apostrophe. Thus, the low-side LDFET shown in FIG. 6 includes the following elements: source region 646', drain region 652', source contact 654', drain contact 656', and gate electrode 668'.

In this example, the high-side source region 646 is connected to the low-side drain region 652' by the second front-side connection 682, which extends over the low-side source region 646', which is connected to ground node of the switch circuit 10 through a substrate contact. This example illustrates how the use of a substrate contact increases the amount of front-side space available and thereby increases the interconnect options that are available to a circuit designer.

Metal layers (e.g., the contacts 680 and 682) shown in FIG. 6 generally represent multiple metal layers that route connections as needed, including top metal layers for semiconductor die pads (e.g., similar to 238a-d, 238a'-c', and 238a"-b") and additional metal layers between the semiconductor die pads and the insulating material or the active layer as mentioned above for the metal layers in other embodiments. Some metal layers, connections, bond-wires, or other features have been omitted for simplicity. Intervening metal layers, conductive adhesive, or other metal bonding structures may be present. The simplified diagrammatic cross-sectional side view shows only a single transistor "finger" for simplicity. In some embodiments, as discussed with reference to FIG. 17, multiple transistor fingers are connected in parallel to increase the power handling capability of the embodied circuit and to reduce total resistance as required by the application of the embodied circuit.

Figure 7A:
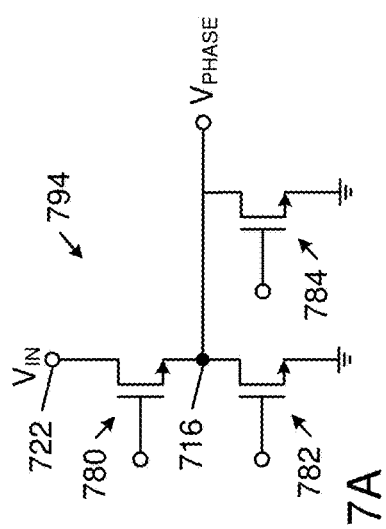
FIG. 7A is a circuit diagram of an example of a high power semiconductor switch incorporating some embodiments.

FIG. 7A shows an example of a high power semiconductor switch circuit 794 that includes a high-side field effect transistor (FET) 780, a first low-side FET 782, and a second low-side FET 784. The source of the high-side FET 780 is coupled to the drain of the first low-side FET 782 and to the drain of the second low-side FET 784 at a phase node 716.

Figure 7B:
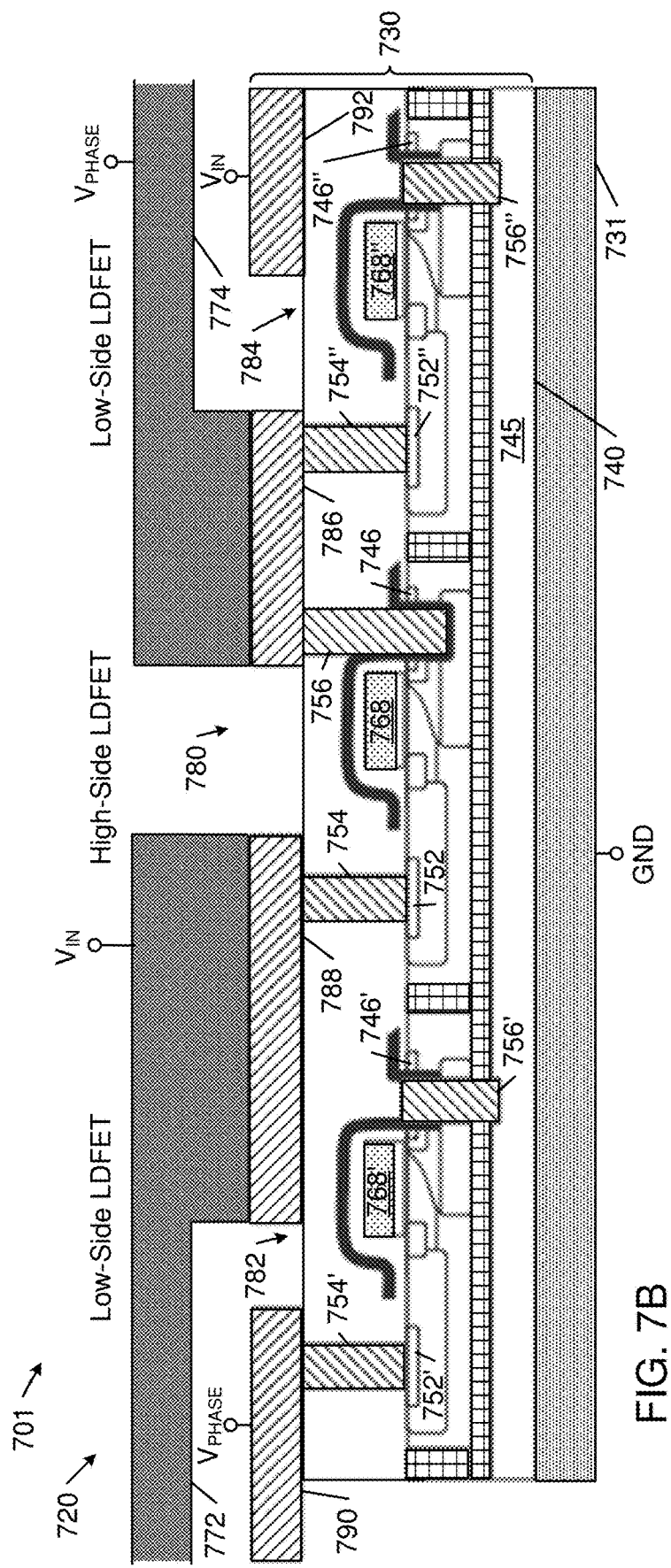
FIG. 7B is a diagrammatic cross-sectional side view of a simplified example of a portion of an integrated circuit package, in accordance with some embodiments.

FIG. 7B shows a simplified diagrammatic cross-sectional side view of a portion of an integrated circuit (IC) package 701 including a leadframe structure 720 embodying the high power switch circuit 794 of FIG. 7A, in accordance with some embodiments. The portion of the leadframe structure 720 shown generally includes an electrically conductive paddle 731, a first electrically conductive clip 772, and a second electrically conductive clip 774. The IC package 701 also includes a semiconductor die 730. Portions of the leadframe structure 720 are similar to portions of the leadframe structures 220/220'/220" discussed with reference to FIGS. 2A-C. For example: the electrically conductive paddle 731 is similar to the electrically conductive paddle 231/231'/231"; the first electrically conductive clip 772 is similar to the first electrically conductive clip 272/272'/272"; and the second electrically conductive clip 774 is similar to the second electrically conductive clip 274/274'/274".

For simplicity, only portions of the first electrically conductive clip 772 and the second electrically conductive clip 774 are shown in FIG. 7B. It is to be understood that these portions are each part of respective electrically conductive clip structures that are similar to the electrically conductive clip structures 272" and 274". Thus, the first electrically conductive clip 772 is electrically connected to a first package lead connection portion (not shown) that is similar to the first package lead connection portion 281/281". Similarly, the second electrically conductive clip 774 is electrically connected to a second package lead connection portion (not shown) that is similar to the second package lead connection portion 283/283".

In the example embodiment shown, the semiconductor die 730 embodies the high power semiconductor switch circuit 794 that includes the one high-side LDFET 780 and the two low-side LDFETs 782 and 784. In one example configuration, a first front-side contact 786 connects a source contact 756 of the high-side LDFET 780 and a drain contact 754" of the low-side LDFET 784 to the phase node 716 ($V_{PHASE}$) of the switch circuit 795 (see FIG. 7A), a second front-side contact 788 connects a drain contact 754 of the high-side LDFET 780 to the input node 722 ($V_{IN}$) of the switch circuit 794, a third front-side contact 790 connects a drain contact 754' to the phase node ($V_{PHASE}$), and a fourth front-side contact 792 connects a drain contact of an optional fourth high-side LDFET (not shown) to the input node ($V_{IN}$) of the switch circuit 10. The first front-side contact 786 and the third front-side contact 790 are electrically coupled to each other out of plane to the cross-section shown in FIG. 7B. Similarly, the second front-side contact 788 and the fourth front-side contact 792 are electrically coupled to each other out of plane to the cross-section shown in FIG. 7B (if the optional fourth high-side LDFET is used).

Some of the elements of the high-side LDFET 32 of the semiconductor die 30 shown in FIG. 3 function in similar ways as the corresponding elements of the high-side LDFET 780 shown in FIG. 7B. In this regard, the functionally similar elements of the high-side LDFET 780 of FIG. 7B are labeled with the reference numbers of the corresponding elements of the high-side LDFET of FIG. 3 preceded by the number "7". For example, the drain region of the high-side LDFET 780 of FIG. 7B that corresponds to the functionally similar drain region 52 of the high-side LDFET 32 of FIG. 3 is labeled with reference number "752". Thus, the high-side LDFET 780 includes the following elements: source region 746, drain region 752, drain contact 754, source contact 756, and gate electrode 768. In addition, the functionally similar elements of the low-side LDFET 782 are labeled with the reference numbers of the corresponding elements of the high-side LDFET followed by an apostrophe. Thus, the low-side LDFET 782 shown in FIG. 7B includes the following elements: source region 746', drain region 752', drain contact 754', source contact 756', and gate electrode 768'. Similarly, the functionally similar elements of the low-side LDFET 784 are labeled with the reference numbers of the corresponding elements of the high-side LDFET followed by a double apostrophe. Thus, the low-side LDFET 784 shown in FIG. 7B includes the following elements: source region 746", drain region 752", drain contact 754", source contact 756", and gate electrode 768".

In this example, the high-side source region 746 and the adjacent low-side drain region 752" are interconnected by the first front-side contact 786 and the high-side source contact 756 and the low-side drain contact 754". By using substrate contacts 756' and 756" for connecting the source regions 746' and 746", respectively, to the ground node (GND), a larger metal area is available for the front-side phase node contact 790 for the low-side drain region 752' to enable the out-of-plane resistance to be reduced.

As shown, the first electrically conductive clip 772 is electrically coupled to the second front-side contact 788, and the second electrically conductive clip 774 is electrically coupled to the first front-side contact 786. A substrate contact 740 is electrically coupled to the electrically conductive paddle 731. The first electrically conductive clip 772 is electrically connected to the first package lead connection portion (not shown) and thereby electrically connected to a first set of electrically conductive package leads (not shown) which are similar to the electrically conductive perimeter package leads 260a' of FIG. 2B. The second electrically conductive clip 774 is electrically connected to the second package lead connection portion (not shown) and is thereby electrically connected to a second set of electrically conductive package leads (not shown) which are similar to the electrically conductive perimeter package leads 260*b*' of FIG. 2B.

Metal layers (e.g., the contacts 786, 788, 790, 792) shown in FIG. 7B generally represent multiple metal layers that route connections as needed, including top metal layers for semiconductor die pads (e.g., similar to 238*a-d*, 238*a*'-c', and 238*a*"-b") and additional metal layers between the semiconductor die pads and the insulating material or the active layer as mentioned above for the metal layers in other embodiments. Some metal layers, connections, bond-wires, or other features have been omitted for simplicity. Intervening metal layers, conductive adhesive, or other metal bonding structures may be present. The simplified diagrammatic cross-sectional side view shows only a single transistor "finger" for simplicity. In some embodiments, as discussed with reference to FIG. 17, multiple transistor fingers are connected in parallel to increase the power handling capability of the embodied circuit and to reduce total resistance as required by the application of the embodied circuit.

Numerous variations in the structures and arrangements of the constituent LDFETs that can be used to implement integrated LDFET devices are possible. The following disclosure describes individual LDFET structures that can replace one or both of the constituent LDFETs of the integrated LDFET circuits shown in FIGS. 3 and 4 to create different integrated LDFET circuit embodiments. In addition, two or more of these individual LDFET structures may be combined with one another to create additional integrated LDFET circuit embodiments. Each of the following individual LDFET structures includes elements that are functionally similar to elements of the high-side LDFET 32 shown in FIG. 3. For ease of comprehension, the functionally similar elements of the individual LDFET structures are labeled with the same reference numbers of the corresponding elements of the high-side LDFET 32 followed by two apostrophes.

Figure 8A:
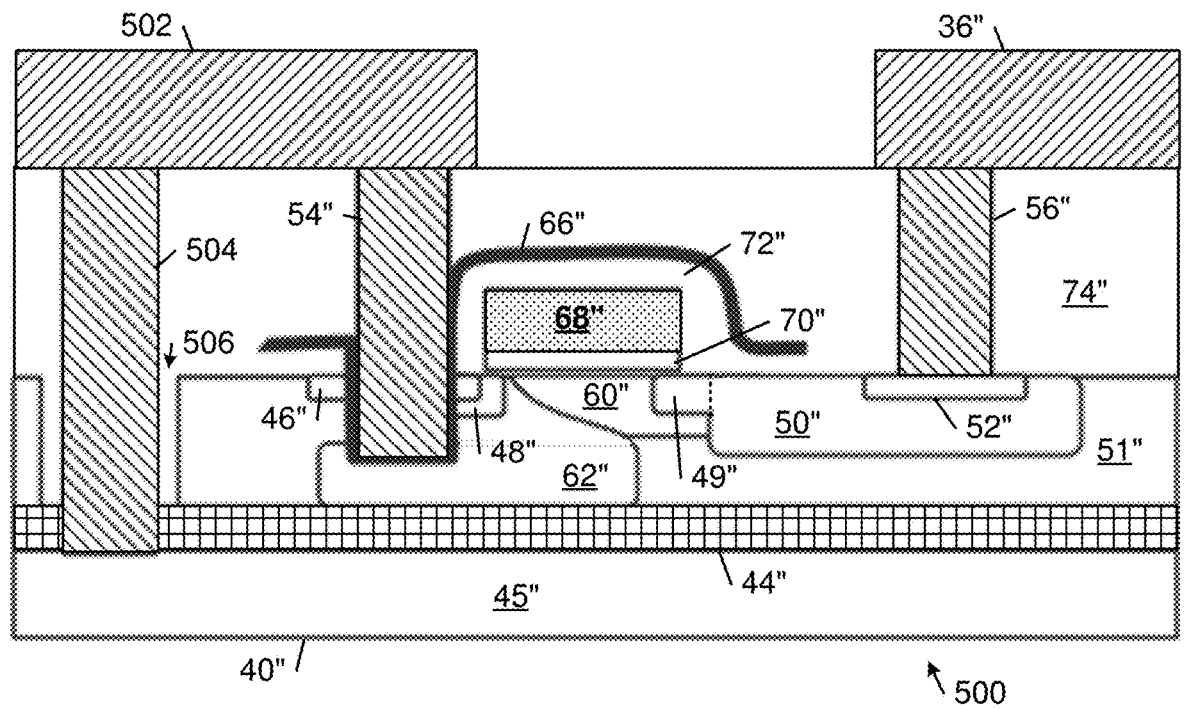
FIG. 8A is a diagrammatic cross-sectional side view of a simplified example of a LDFET structure, in accordance with some embodiments.

FIG. 8A shows a diagrammatic cross-sectional side view of an example of a LDFET 500 in a source-down configuration. The LDFET 500 includes the following elements: substrate contact 40", buried dielectric layer 44", substrate 45", source region 46", doped region 48", LDD region 50" with a heavier doped extension region 49" that are formed in a doped region 51", drain region 52", source contact 54", drain contact 56", body region 60", deep well region 62", gate shield 66", gate electrode 68", and dielectric material 70", 72", 74". In this example, instead of extending through the deep well 62" as described above in connection with the source contact 54' of the low-side LDFET 34 example shown in FIG. 3, the source contact 54" shown in FIG. 8A includes a front-side contact 502 that is connected to a substrate contact 504 that extends through an opening 506 in the active layer and further extends through the buried dielectric layer 44" to the substrate 45". In some examples, the opening 506 in the active layer allows the substrate contact through the buried dielectric layer 44" to be made using an oxide etch process and does not require a silicon etch process.

Figure 8B:
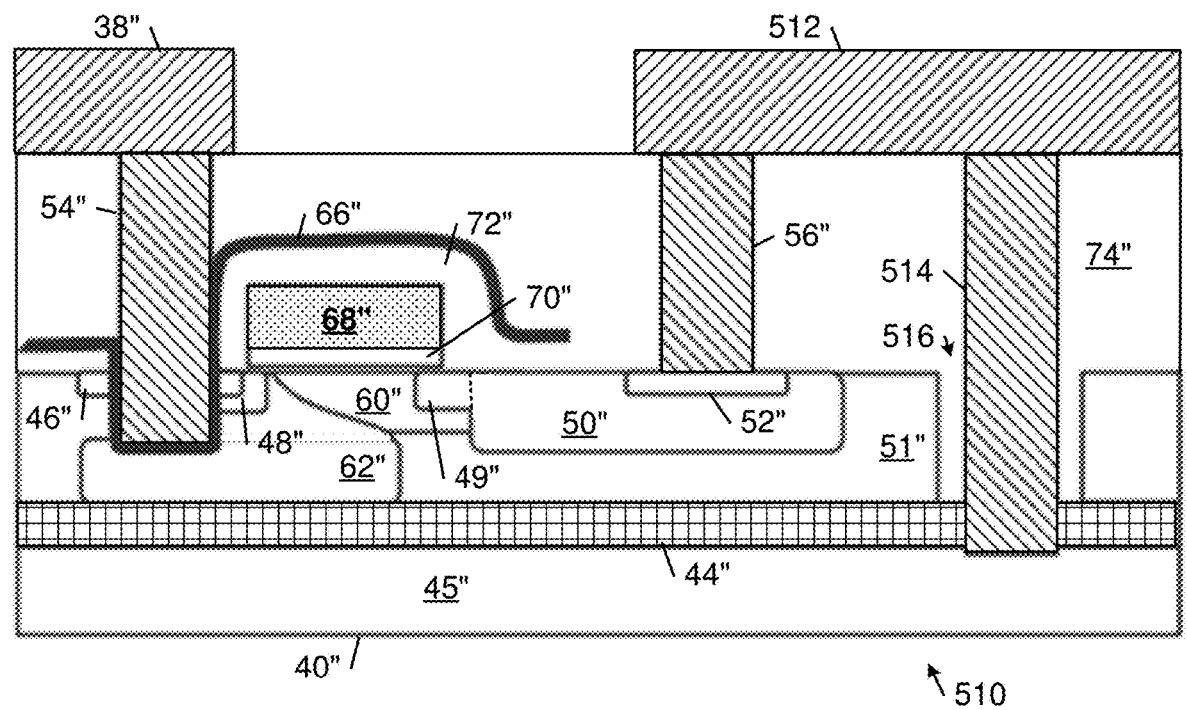
FIG. 8B is a diagrammatic cross-sectional side view of a simplified example of a LDFET structure, in accordance with some embodiments.

FIG. 8B shows a diagrammatic cross-sectional side view of an example of a LDFET 510 in a drain-down configuration. The LDFET 510 includes the following elements: substrate contact 40", buried dielectric layer 44", substrate 45", source region 46", doped region 48", LDD region 50" with a heavier doped extension region 49" that are formed in a doped region 51", drain region 52", source contact 54", drain contact 56", body region 60", deep well region 62", gate shield 66", gate electrode 68", and dielectric material 70", 72", 74". In this example, instead of extending through the drain and LDD regions 52", 50", the drain contact 56" includes a front-side contact 512 that is connected to a substrate contact 514 that extends through an opening 516 in the active layer and further extends through the buried dielectric layer 44" to the substrate 45". In some examples, the opening 516 in the active layer allows the substrate contact 514 through the buried dielectric layer 44" to be made using an oxide etch process and does not require a silicon etch process.

Figure 9A:
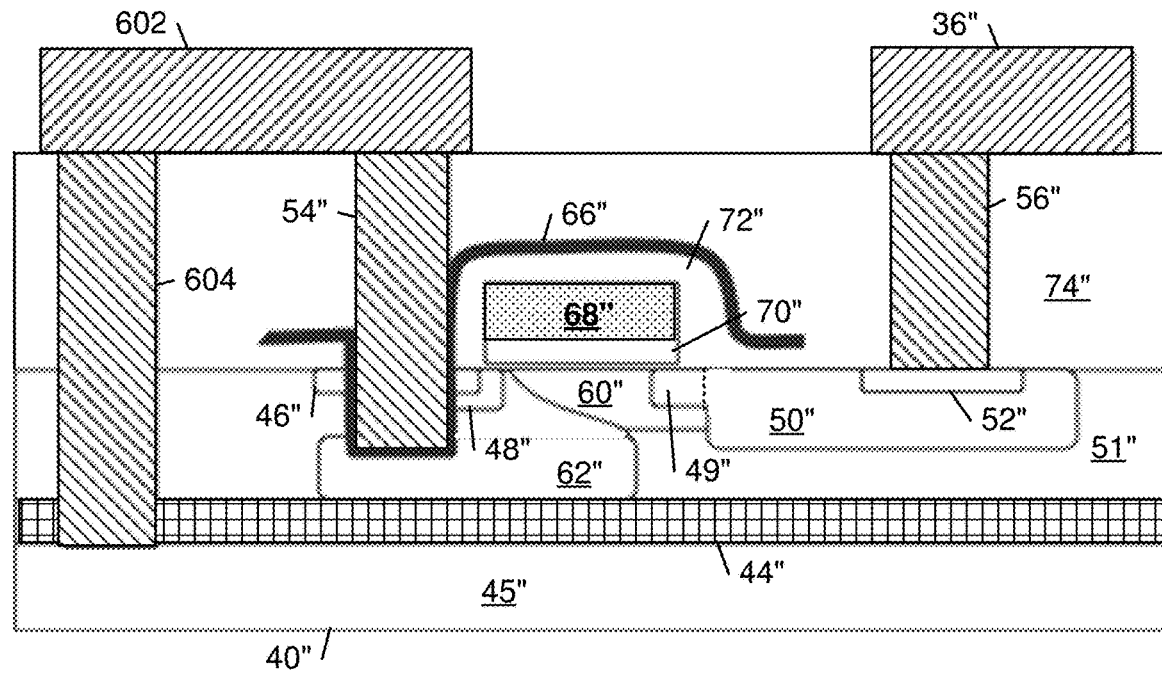
FIG. 9A is a diagrammatic cross-sectional side view of a simplified example of a LDFET structure, in accordance with some embodiments.

FIG. 9A shows a diagrammatic cross-sectional side view of an example of a LDFET 600 in a source-down configuration. The LDFET 600 includes the following elements: substrate contact 40", buried dielectric layer 44", substrate 45", source region 46", doped region 48", LDD region 50" with a heavier doped extension region 49" that are formed in a doped region 51", drain region 52", source contact 54", drain contact 56", body region 60", deep well region 62", gate shield 66", gate electrode 68", and dielectric material 70", 72", 74". In this example, instead of extending through the deep well 62 as described above in connection with the source contact 54' of the low-side LDFET 34 example shown in FIG. 3, the source contact 54" includes a front-side contact 602 that is connected to a substrate contact 604 that extends through the active layer and further extends through the buried dielectric layer 44" to the substrate 45". In some examples, etching the substrate contact through the active layer may eliminate a contact-to-active spacing design rule, decreasing transistor pitch.

Figure 9B:
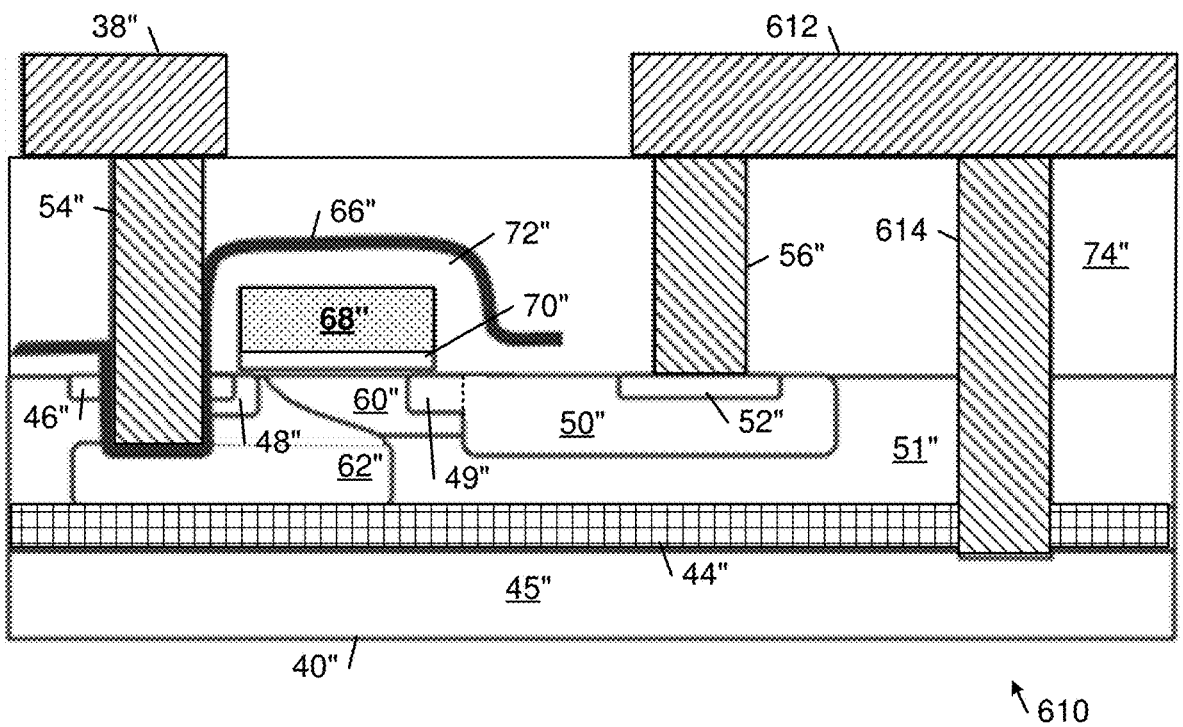
FIG. 9B is a diagrammatic cross-sectional side view of a simplified example of a LDFET structure, in accordance with some embodiments.

FIG. 9B shows a diagrammatic cross-sectional side view of an example of a LDFET 610 in a drain-down configuration. The LDFET 610 includes the following elements: substrate contact 40", buried dielectric layer 44", substrate 45", source region 46", doped region 48", LDD region 50" with a heavier doped extension region 49" that are formed in a doped region 51", drain region 52", source contact 54", drain contact 56", body region 60", deep well region 62", gate shield 66", gate electrode 68", and dielectric material 70", 72", 74". In this example, instead of extending through the drain and LDD regions 52", 50", the drain contact 56" includes a front-side contact 612 that is connected to a substrate contact 614 that extends through the active layer and further extends through the buried dielectric layer 44" to the substrate 45". In some examples, etching the substrate contact through the active layer may eliminate a contact-to-active spacing design rule, decreasing transistor pitch.

Figure 10A:
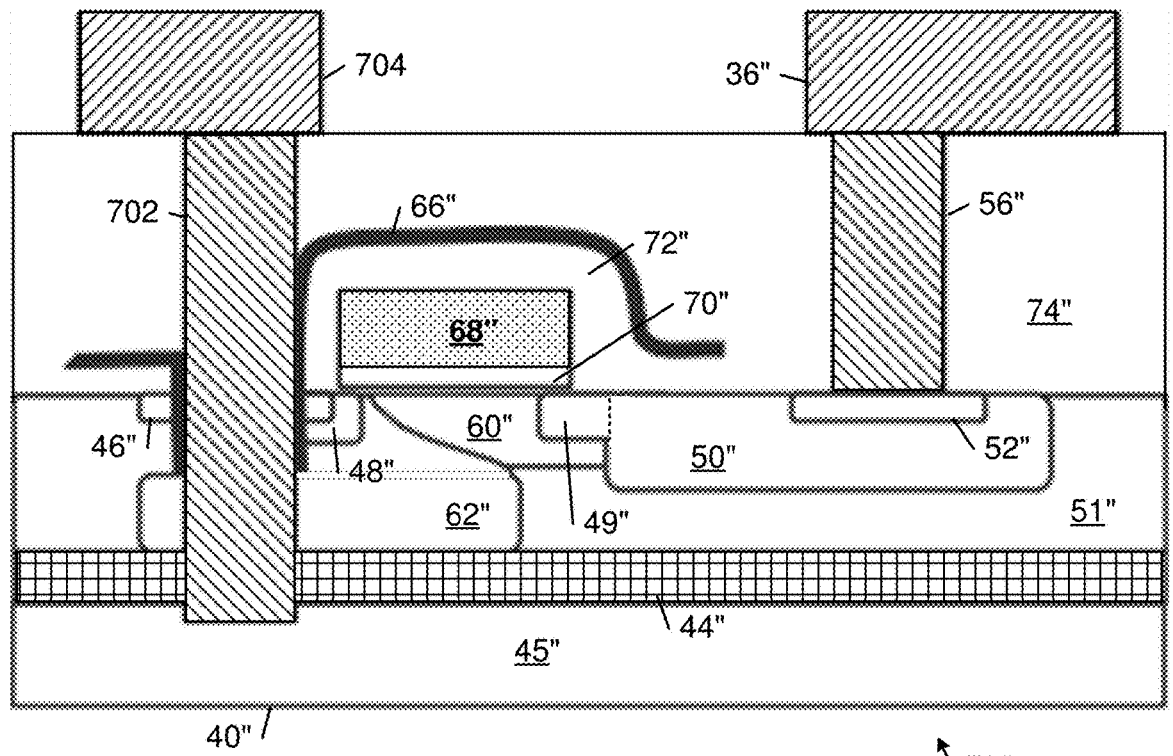
FIG. 10A is a diagrammatic cross-sectional side view of a simplified example of a LDFET structure, in accordance with some embodiments.

FIG. 10A shows a diagrammatic cross-sectional side view of an example of a LDFET 700 in a source-down configuration. The LDFET 700 includes the following elements: substrate contact 40", buried dielectric layer 44", substrate 45", source region 46", doped region 48", LDD region 50" with a heavier doped extension region 49" that are formed in a doped region 51", drain region 52", source contact 54", drain contact 56", body region 60", deep well region 62", gate shield 66", gate electrode 68", and dielectric material 70", 72", 74". In this example, in addition to extending from above the active layer to the substrate 45" as described above in connection with the source contact 54' of the low-side LDFET 34 example shown in FIG. 3, the source contact 702 also extends upward through the electrically insulating material 74" to a front-side contact 704.

Figure 10B:
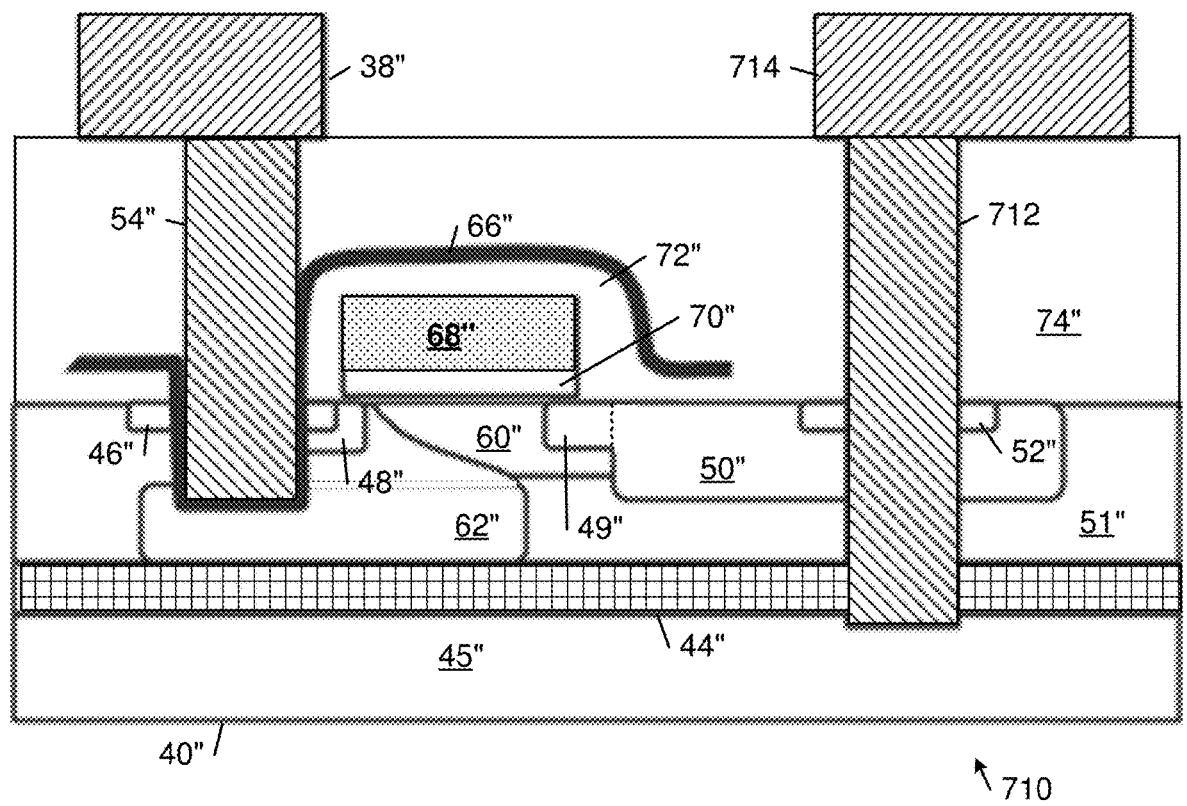
FIG. 10B is a diagrammatic cross-sectional side view of a simplified example of a LDFET structure, in accordance with some embodiments.

FIG. 10B shows a diagrammatic cross-sectional side view of an example of a LDFET 710 in a drain-down configuration. The LDFET 710 includes the following elements: substrate contact 40", buried dielectric layer 44", substrate 45", source region 46", doped region 48", LDD region 50" with a heavier doped extension region 49" that are formed in a doped region 51", drain region 52", source contact 54", drain contact 56", body region 60", deep well region 62", gate shield 66", gate electrode 68", and dielectric material 70", 72", 74". In this example, a drain contact 712 extends upward from the substrate 45", through the doped, LDD, drain, and electrically insulating material regions 51", 50", 52", 74" to a front-side contact 714.

Figure 11A:
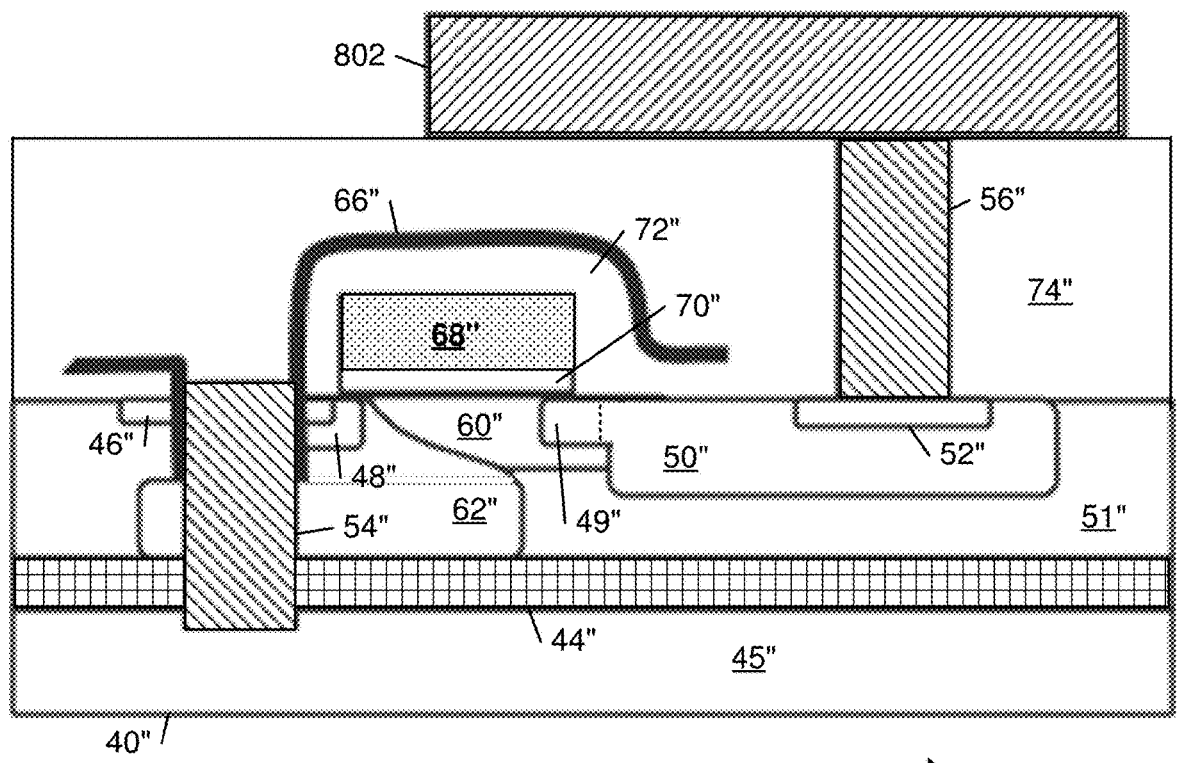
FIG. 11A is a diagrammatic cross-sectional side view of a simplified example of a LDFET structure, in accordance with some embodiments.

FIG. 11A shows a diagrammatic cross-sectional side view of an example of a LDFET 800 in a source-down configuration. The LDFET 800 includes the following elements: substrate contact 40", buried dielectric layer 44", substrate 45", source region 46", doped region 48", LDD region 50" with a heavier doped extension region 49" that are formed in a doped region 51", drain region 52", source contact 54", drain contact 56", body region 60", deep well region 62", gate shield 66", gate electrode 68", and dielectric material 70", 72", 74". In this example, the source contact 54" does not require any metal 1 connections, as described above with respect to the source contact 54' of the low-side LDFET 34 example shown in FIG. 3. For this reason, the front-side contact 802 can be laid out without regard to the location of the source contact 54". In this example, the metal 1 front-side contact 802 may overlie the source contact 54" or not, depending on circuit design requirements.

Figure 11B:
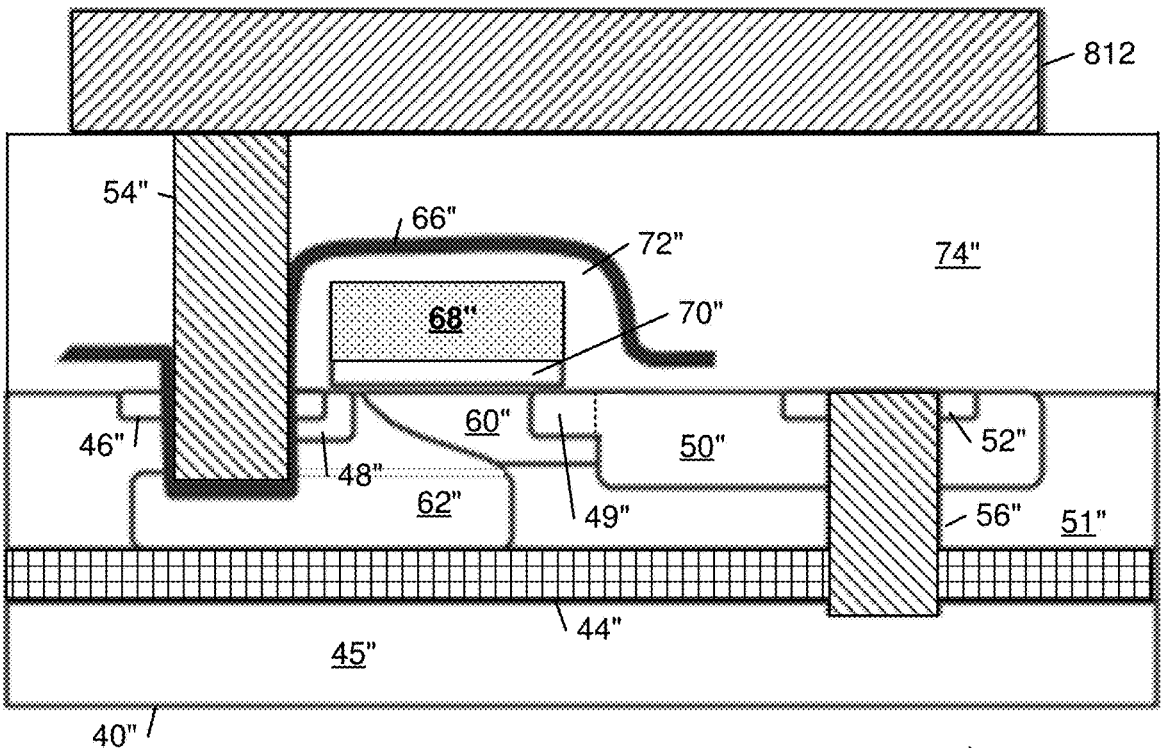
FIG. 11B is a diagrammatic cross-sectional side view of a simplified example of a LDFET structure, in accordance with some embodiments.

FIG. 11B shows a diagrammatic cross-sectional side view of an example of a LDFET 810 in a drain-down configuration. The LDFET 810 includes the following elements: substrate contact 40", buried dielectric layer 44", substrate 45", source region 46", doped region 48", LDD region 50" with a heavier doped extension region 49" that are formed in a doped region 51", drain region 52", source contact 54", drain contact 56", body region 60", deep well region 62", gate shield 66", gate electrode 68", and dielectric material 70", 72", 74". In this example, the drain contact 56" does not require a metal 1 connection. For this reason, the front-side contact 812 can be laid out without regard to the location of the drain contact 56". For example, the metal 1 front-side contact 802 may overlie the drain contact 56" or not, depending on circuit design requirements.

Figure 12A:
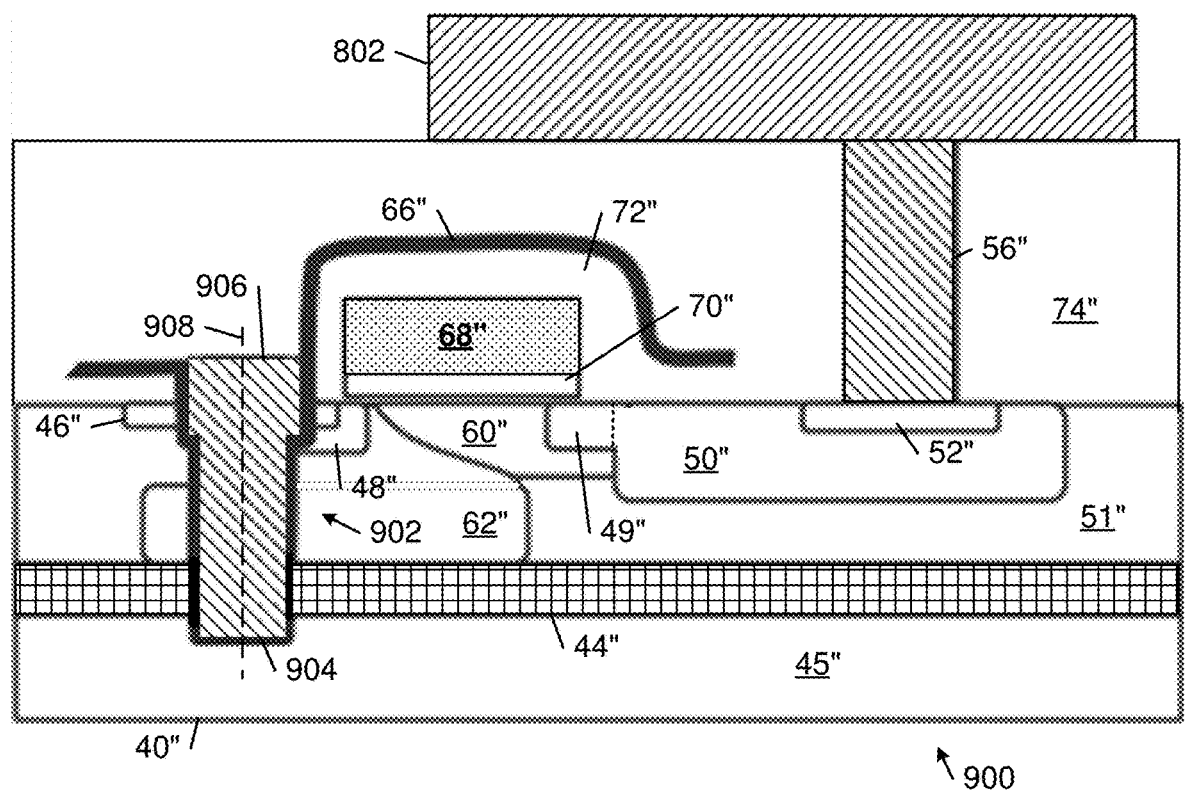
FIG. 12A is a diagrammatic cross-sectional side view of a simplified example of a LDFET structure, in accordance with some embodiments.

FIG. 12A shows a diagrammatic cross-sectional side view of an example of a LDFET 900 in a source-down configuration. The LDFET 900 includes the following elements: substrate contact 40", buried dielectric layer 44", substrate 45", source region 46", doped region 48", LDD region 50" with a heavier doped extension region 49" that are formed in a doped region 51", drain region 52", source contact 54", drain contact 56", body region 60", deep well region 62", gate shield 66", gate electrode 68", and dielectric material 70", 72", 74". This example corresponds to the LDFET 800 shown in FIG. 11A, except that it includes a source contact 902 with a relatively narrow bottom portion 904 and a wider top shelf portion 906 that reduces the contact resistance to the source region 46". In particular, the source contact 902 extends through the active layer to the substrate 45" along an axial dimension 908, the top shelf portion 906 extends into the active layer and is characterized by a first width in a lateral dimension orthogonal to the axial dimension 908, and the bottom portion 904 extends through the active layer to the substrate 45" and is characterized by a second width in the lateral dimension that is smaller than the first width.

In some examples, the source contact 902 is formed by performing a shallow wide contact etch, followed by a second deep narrow contact etch.

In some examples, the resistance of the source contact 902 can be further reduced by implanting the source 46" after the first shallow wide contact etch is performed.

In some examples, the resistance between the source contact 902 and the body can be further reduced by forming the shelf portion 906 at a deeper location within the deep well region 62". This approach may be combined with a heavy implant to the deep well region 62" after the second deep narrow contact etch is performed.

In the illustrated example, the gate shield 66" is deposited after the second deep narrow contact etch is performed. In other examples, the gate shield 66" is deposited after the first shallow wide contact etch is performed.

In some examples, after the deep narrow contact etch is performed, the substrate 45" is implanted through the opening formed by the deep narrow contact etch with a heavy implant of the same dopant type of the substrate 45" (e.g., p+ implant if the substrate is p-type) to improve substrate contact resistance.

Figure 12B:
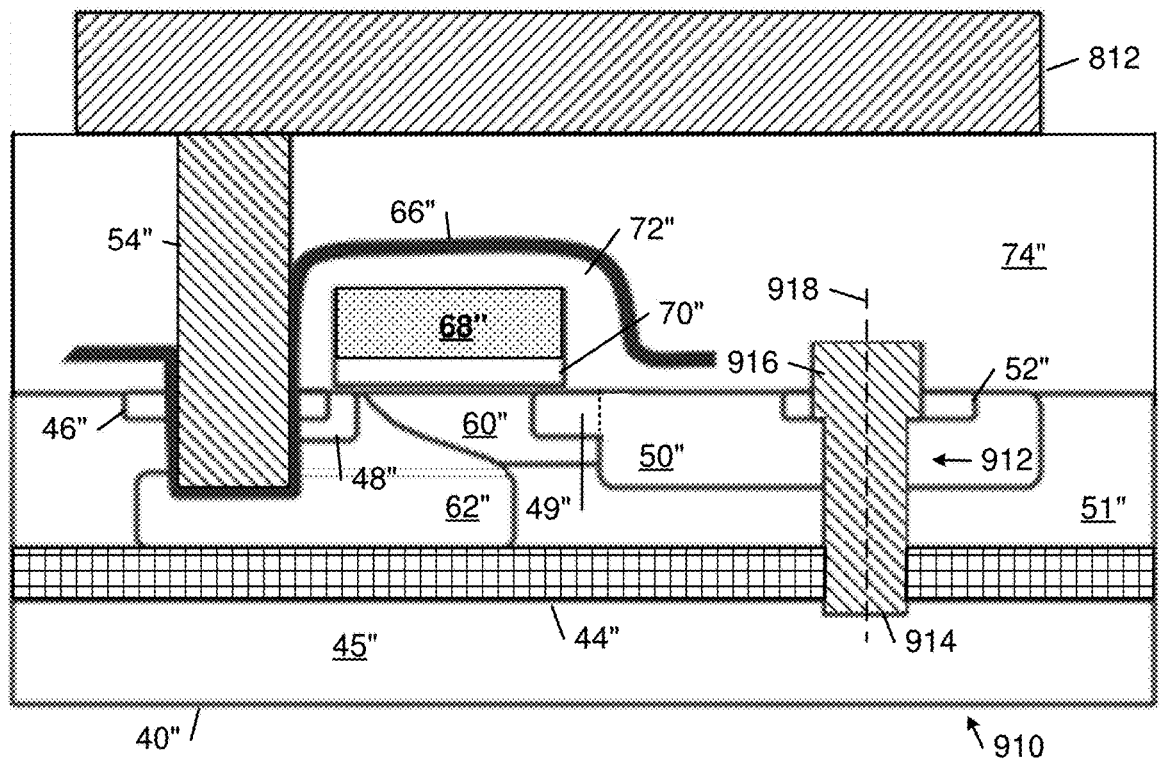
FIG. 12B is a diagrammatic cross-sectional side view of a simplified example of a LDFET structure, in accordance with some embodiments.

FIG. 12B shows a diagrammatic cross-sectional side view of an example of a LDFET 910 in a drain-down configuration. The LDFET 910 includes the following elements: substrate contact 40", buried dielectric layer 44", substrate 45", source region 46", doped region 48", LDD region 50" with a heavier doped extension region 49" that are formed in a doped region 51", drain region 52", source contact 54", drain contact 56", body region 60", deep well region 62", gate shield 66", gate electrode 68", and dielectric material 70", 72", 74". This example corresponds to the LDFET 810 shown in FIG. 11B, except that it includes a drain contact 912 with a relatively narrow bottom portion 914 and a wider top shelf portion 916 that reduces the contact resistance to the drain region 52". In particular, the drain contact 912 extends through the active layer to the substrate 45" along an axial dimension 918, the top shelf portion 916 extends into the active layer and is characterized by a first width in a lateral dimension orthogonal to the axial dimension 918, and the bottom portion 914 extends through the active layer to the substrate 45", and is characterized by a second width in the lateral dimension that is smaller than the first width.

In some examples, the source contact 912 is formed by performing a shallow wide contact etch, followed by a second deep narrow contact etch. In other examples, the deep narrow contact etch is performed first, and then a wide oxide etch is performed to expose the drain region 52" at the surface of the active layer.

In some examples, the source-down and drain-down configurations of the LDFETs 900 and 910 may be combined to produce a single LDFET in which both the source region 46" and the drain region 52" are connected to the substrate 45".

The following disclosure describes examples of layout options for the individual LDFET structures shown in FIGS. 8A-12B.

Figure 13:
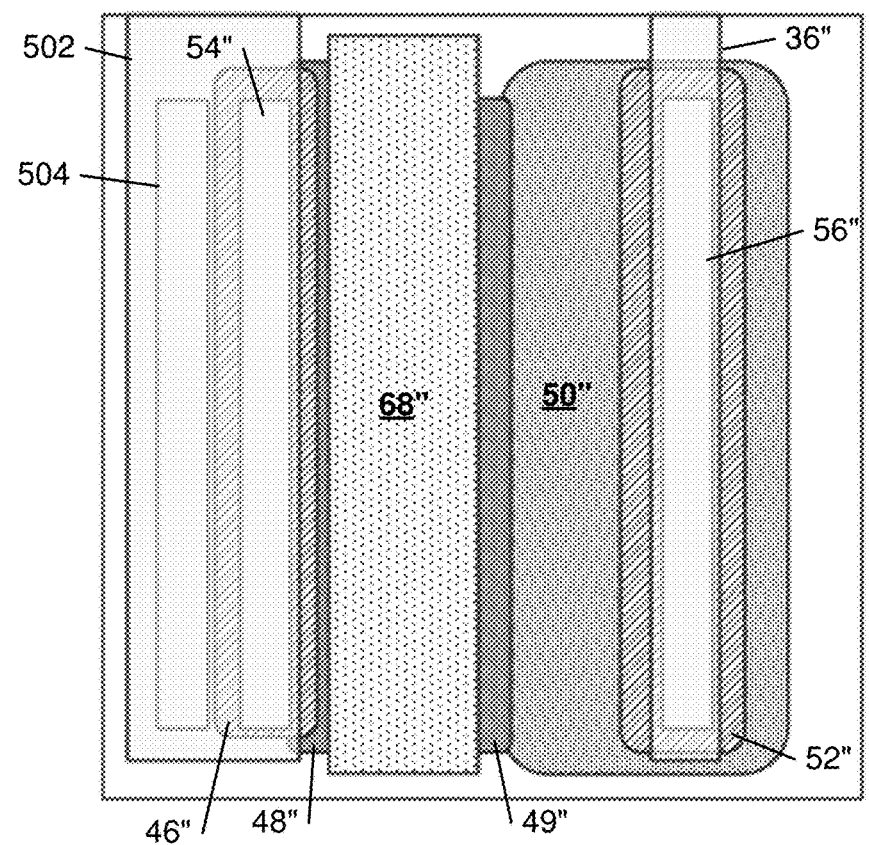
FIG. 13 is a diagrammatic top-down view of a simplified example layout for the LDFET structures of FIGS. 8A and 9A, in accordance with some embodiments.

FIG. 13 shows a diagrammatic top-down view of an example layout for the source-down LDFET structure 500 of FIG. 8A in which the substrate contact 504 is displaced laterally from the source region 46". In this example, the front-side contact 502 electrically connects the source contact 54" to the substrate contact 504 that extends through the active layer and the buried dielectric layer to the substrate. As shown in FIG. 13, adding the substrate contact 504 adjacent to the source contact 54" increases the transistor pitch, thereby increasing the semiconductor die area and cost. The example layout shown in FIG. 13 is equally applicable to the source-down LDFET structure 600 of FIG. 9A, e.g., with respect to the substrate contact 604 and the front-side contact 602. In addition, a horizontally reflected version of the layout shown in FIG. 13 can be used for the drain-down LDFET structures 510, 610 shown in FIGS. 8B and 9B, respectively.

Figure 14:
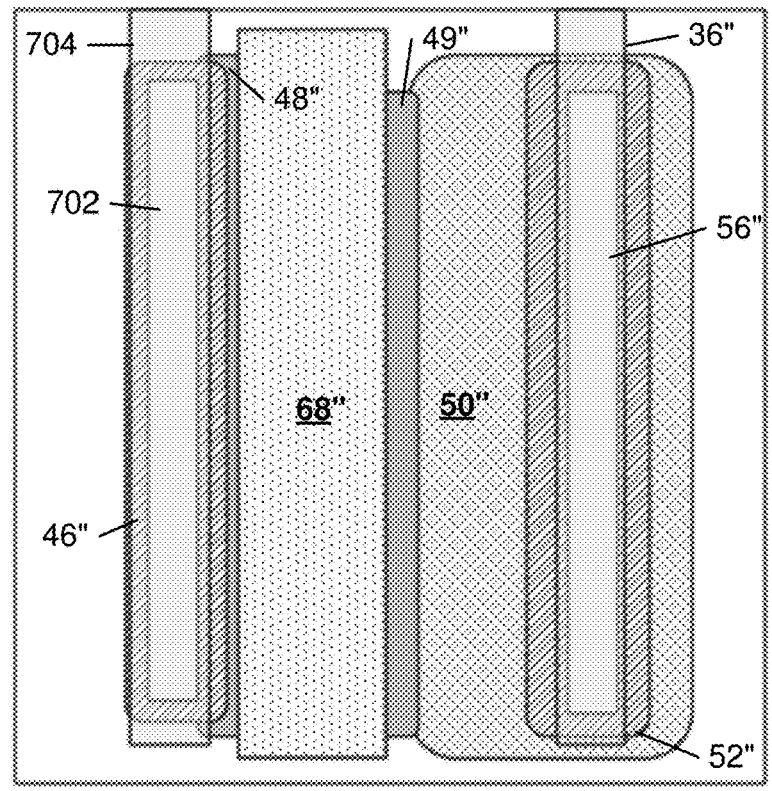
FIG. 14 is a diagrammatic top-down view of a simplified first example layout for the LDFET structure of FIG. 10A, in accordance with some embodiments.

FIG. 14 shows a diagrammatic top-down view of a first example layout for the LDFET structure 700 of FIG. 10A in which the source contact 702 extends from the substrate 45", through the source 46", to the front-side contact 704. Thus, in cases in which the source contact 702 connects both the source region 46" and the substrate 45", semiconductor die area and cost may be saved through the use of a single contact as compared with the approach shown in FIG. 13. In some examples, the source region 46" may be connected on the sides of the source contact 702. In some examples, a shelf can be created at the top of the source to improve source contact resistance (see, e.g., FIG. 12A). A horizontally reflected version of the layout shown in FIG. 14 can be used for the drain-down LDFET structure 710 shown in FIG. 10B.

Figure 15:
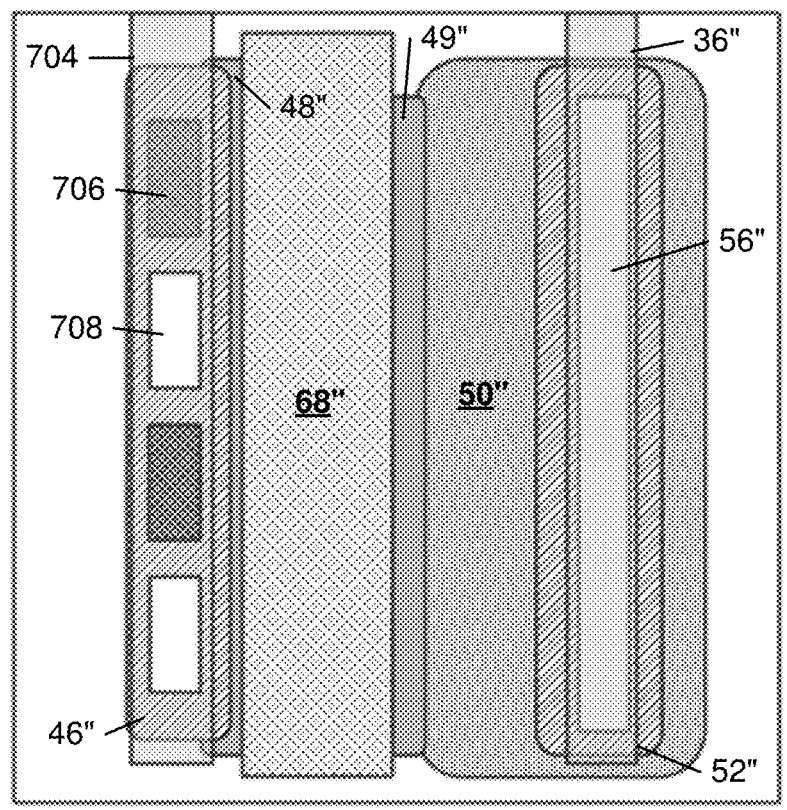
FIG. 15 is a diagrammatic top-down view of a simplified second example layout for the LDFET structure of FIG. 10A, in accordance with some embodiments.

In some examples, the substrate contact includes a first set of parallel substrate sub-contacts that are interleaved with a second set of parallel channel sub-contacts that are connected to one of the sources and drains of the first and second LDFETs, where the respective sub-contacts of the first and second sets extend to a surface above the active layer where they are alternately arranged in a row. For example, FIG. 15 shows a diagrammatic top-down view of a second example layout for the LDFET structure 700 of FIG. 10A in which the source contact is implemented by a planar array of a set of parallel vertical source contacts 706 that extend from the source 46" to the front-side contact 704, and the substrate contact is implemented by a planar array of a set of parallel vertical substrate contacts 708 that are interleaved with and extend from the substrate 45" to the front-side contact 704. Alternating the source contacts 706 and the substrate contacts 708 in this way reduces the transistor pitch as compared to the embodiment shown in FIG. 13. A horizontally reflected version of the layout shown in FIG. 15 can be used for the drain-down LDFET structure 710 shown in FIG. 10B.

Figure 16:
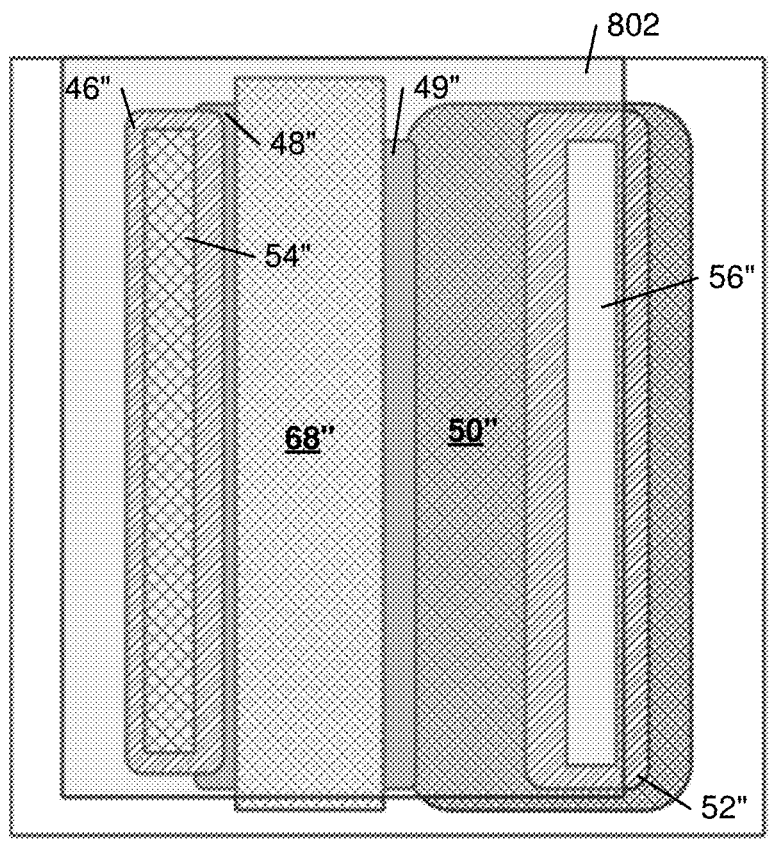
FIG. 16 is a diagrammatic top-down view of a simplified example layout for the LDFET structures of FIGS. 11A and 12A, in accordance with some embodiments.

FIG. 16 shows a diagrammatic top-down view of an example layout for the LDFET structure 800 of FIG. 11A in which the source contact 54" extends to the substrate but does not extend to the front-side of the semiconductor die. As explained above, this feature allows the front-side contact 802 of the drain to be laid out without regard to the location of the source contact 54". In the illustrated example, the front-side drain contact 802 extends over and beyond the source contact 54" without electrically connecting to the source contact 54". The example layout shown in FIG. 16 is equally applicable to the source-down LDFET structure 900 of FIG. 12A. In addition, a horizontally reflected version of the layout shown in FIG. 16 can be used for the drain-down LDFET structures 810, 910 shown in FIGS. 11B and 12B.

Figure 17:
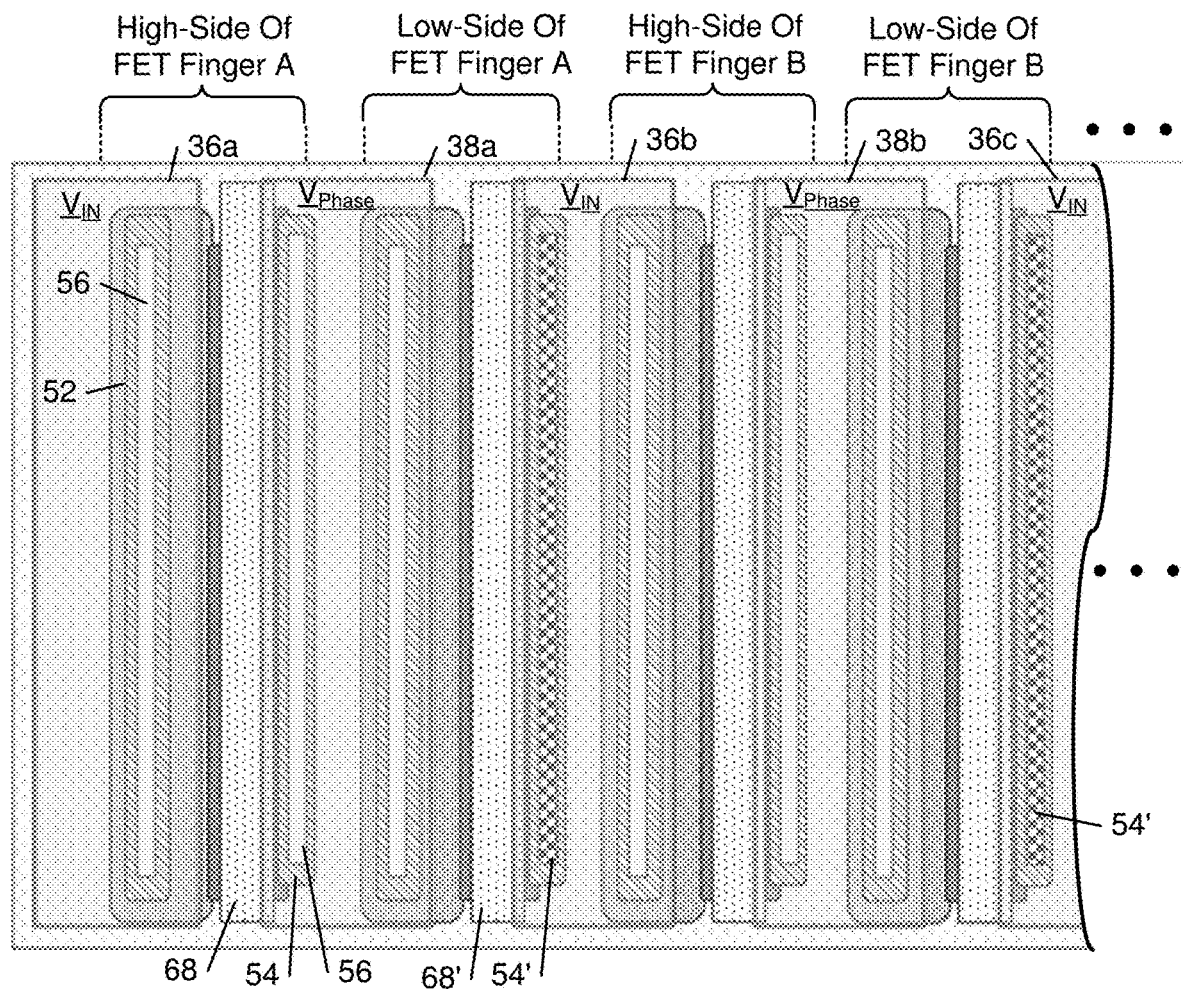
FIG. 17 is a diagrammatic top-down view of a simplified example layout of the LDFET circuit of FIG. 3, in accordance with some embodiments.

FIG. 17 shows a diagrammatic top-down view of an example layout for the LDFET circuit of FIG. 3. In this example, the high-side and low-side LDFETs 32, 34 are implemented by a set of multiple interleaved high-side and low-side LDFET "fingers" that are interconnected by a set of alternating electrically conducting paths of input node metallization (e.g., $V_{IN}$) and phase node metallization (e.g., $V_{PHASE}$). In this approach, the constituent high-side and low-side LDFET fingers can be placed close together, allowing the interconnecting metallization paths between the high-side drain and the low-side source to be short, low impedance connections that collectively have a lower overall impedance than the impedance through a circuit structure in which the high-side and low-side transistors are laid out in separate sections of a semiconductor die. As a result, the impedance through the LDFET circuit from the high-side source to the low-side drain is reduced. In some examples, additional layers of metal may be needed to pull out the respective connections from the LDFET fingers to the package pins. In some examples, multiple of the input node finger metallization paths (e.g., 36a, 36b, and 36c) are connected to a first electrically conducting output path that is connected to the input node (e.g., $V_{IN}$), and multiple of the phase node finger metallization paths (e.g., 38a and 38b) are connected to a second electrically conducting output path that is connected to the phase node (e.g., $V_{PHASE}$).

Figure 18:
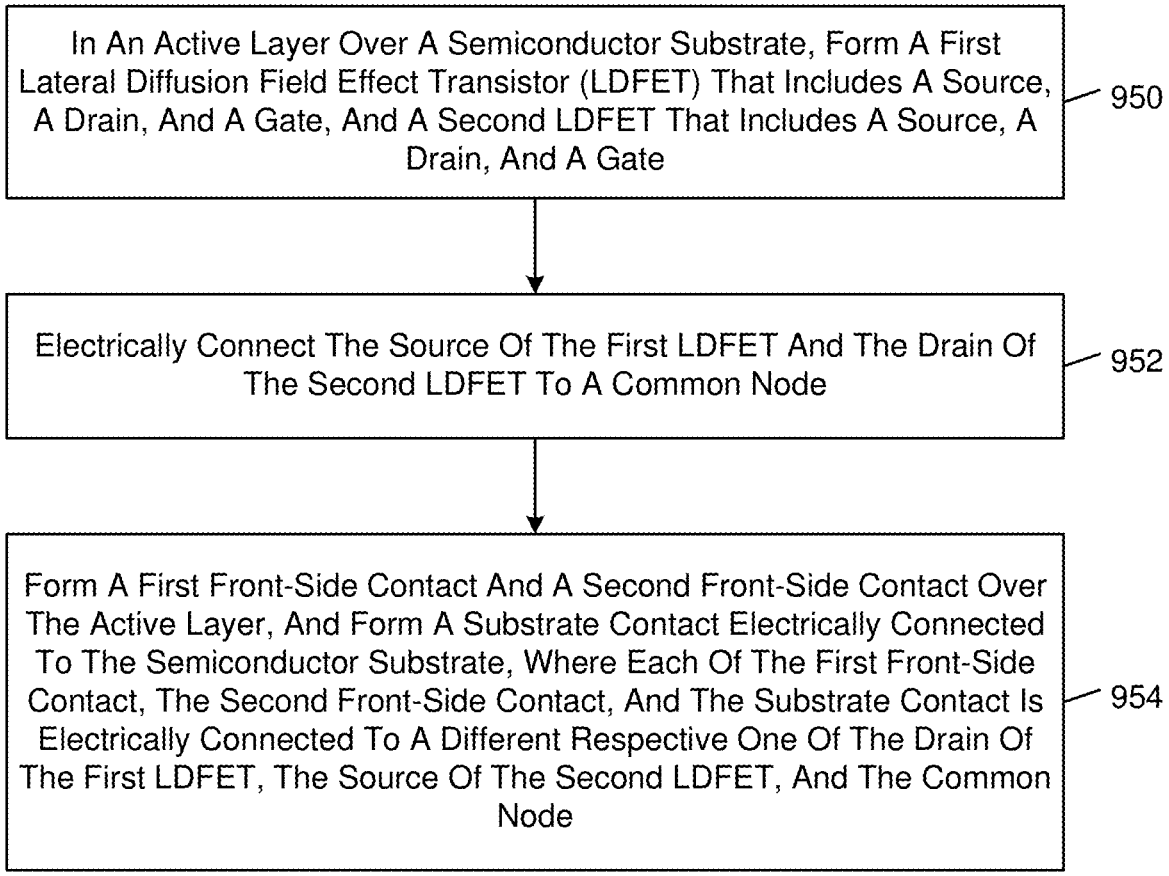
FIG. 18 is a flow diagram of a simplified example of a method of fabricating a semiconductor device, in accordance with some embodiments.

FIG. 18 shows an example of a method for fabricating a semiconductor device. In accordance with this method, a first lateral diffusion field effect transistor (LDFET) that includes a source, a drain, and a gate, and a second LDFET that includes a source, a drain, and a gate are formed in an active layer over a semiconductor substrate (FIG. 18, block 950). The source of the first LDFET and the drain of the second LDFET are electrically connected to a common node (FIG. 18, block 952). A first front-side contact and a second front-side contact are formed over the active layer, and a substrate contact electrically connected to the semiconductor substrate is formed, where each of the first front-side contact, the second front-side contact, and the substrate contact is electrically connected to a different respective one of the drain of the first LDFET, the source of the second LDFET, and the common node (FIG. 18, block 954).

In some examples, a buried dielectric layer is formed between the semiconductor substrate and the active layer, where the substrate contact extends through the buried dielectric layer. In some of these examples, a dielectric isolation barrier that extends through the active layer to the buried dielectric layer also is formed between the first and second LDFETs.

In some examples, the first front-side contact is electrically connected to a first set of one or more of the perimeter package leads of a semiconductor package with a first electrically conductive clip. The second front-side contact is electrically connected to a second set of one or more of the perimeter package leads of the semiconductor package with a second electrically conductive clip. The substrate contact is electrically connected to a paddle of the semiconductor package.

Other embodiments are within the scope of the claims. For example, Semiconductor devices disclosed herein have improved performance in high power conditions. However, the teachings disclosed herein can be used to improve semiconductor devices generally and are not limited to high power applications. Certain methods disclosed herein allow for a cost effective and efficient manner in which to build the disclosed devices. In the particular situations in which the semiconductor device is a transistor, the body of the device is efficiently biased to prevent the device from entering into particular breakdown conditions such as those caused by an increase in the potential of the body of the transistor. Some of these semiconductor devices are therefore useful in situations in which the devices are formed in a thin layer of active material because it is in those situations in which the body of the semiconductor device is more susceptible to the introduction of exogenous charge, as there is less intrinsic charge in the thin active layer to counteract its effect.

Figure 19:
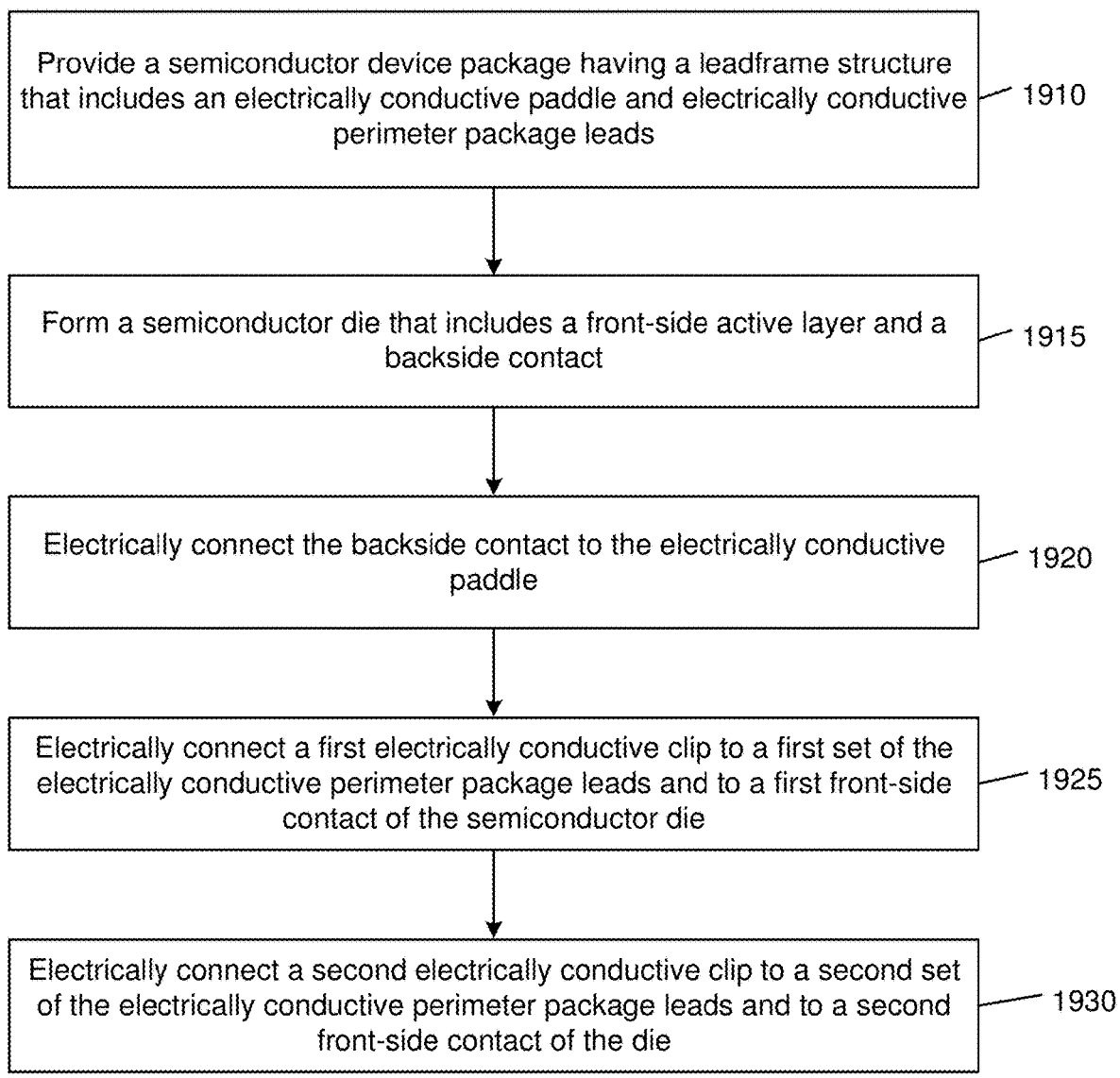
FIG. 19 is a flow diagram of a simplified example of a method for packaging a semiconductor device in a semiconductor package, in accordance with some embodiments.

FIG. 19 shows a simplified example of a method for packaging a semiconductor device in a semiconductor package having a leadframe structure, in accordance with some embodiments. In accordance with this method, a semiconductor device package which has a leadframe structure, which includes an electrically conductive paddle and electrically conductive perimeter package leads, is provided (FIG. 19, block 1910). A semiconductor die is formed, the semiconductor die including a front-side active layer and a backside contact (FIG. 19, block 1915). The semiconductor die formed could be a semiconductor die in accordance with any of the semiconductor dice disclosed herein. The backside contact of the semiconductor die is electrically connected to the electrically conductive paddle (FIG. 19, block 1920). A first electrically conductive clip is electrically connected to a first set of the of the electrically conductive perimeter package leads and to a first front-side contact of the semiconductor die (FIG. 19, block 1925). A second electrically conductive clip is electrically connected to a second set of the of the electrically conductive perimeter package leads and to a second front-side contact of the semiconductor die (FIG. 19, block 1930).

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. An apparatus comprising:
an electrically conductive paddle;
a first electrically conductive clip;
a second electrically conductive clip;
a first transistor in a front-side active layer of a semiconductor die; and
a second transistor in the front-side active layer of the semiconductor die;
and wherein:
the first electrically conductive clip is electrically connected to a first node of the first transistor and to a first node of the second transistor at a front-side of the front-side active layer;
the second electrically conductive clip is electrically connected to a second node of the first transistor at the front-side of the front-side active layer; and
a second node of the second transistor is electrically connected to the electrically conductive paddle at a backside portion of the semiconductor die.

2. The apparatus of claim 1, wherein:
the first transistor comprises a high-side lateral diffusion field effect transistor (LDFET) of a power semiconductor switch circuit; and
the second transistor comprises a low-side LDFET of the power semiconductor switch circuit.

3. The apparatus of claim 1, wherein:
the first node of the first transistor is a source node of the first transistor;
the first node of the second transistor is a drain node of the second transistor;
the second node of the first transistor is a drain node of the first transistor; and
the second node of the second transistor is a source node of the second transistor.

4. The apparatus of claim 1, further comprising:
a semiconductor substrate of the semiconductor die; and
a buried dielectric layer between the semiconductor substrate and the front-side active layer;
and wherein:
the second node of the second transistor is electrically connected through the buried dielectric layer to the electrically conductive paddle.

5. The apparatus of claim 4, further comprising:
a dielectric isolation barrier between the first transistor and the second transistor that extends through the front-side active layer to the buried dielectric layer.

6. The apparatus of claim 1, further comprising:
a third transistor in the front-side active layer of the semiconductor die;
and wherein:
a first node of the third transistor is electrically connected to the first node of the first transistor and the first node of the second transistor; and
a second node of the third transistor is electrically connected at the backside portion of the semiconductor die to the electrically conductive paddle.

7. The apparatus of claim 6, wherein:
the first transistor comprises a high-side lateral diffusion field effect transistor (LDFET) of a power semiconductor switch circuit;
the second transistor comprises a first low-side LDFET of the power semiconductor switch circuit;
the third transistor comprises a second low-side LDFET of the power semiconductor switch circuit;
the first node of the first transistor is a source node of the first transistor;
the first node of the second transistor is a drain node of the second transistor;
the first node of the third transistor is a drain node of the third transistor;
the second node of the first transistor is a drain node of the first transistor;
the second node of the second transistor is a source node of the second transistor; and
the second node of the third transistor is a source node of the third transistor.

8. The apparatus of claim 1, further comprising:
a first front-side contact on the front-side active layer of the semiconductor die, the first front-side contact being electrically connected to the first node of the first transistor and to the first node of the second transistor;
a second front-side contact on the front-side active layer of the semiconductor die, the second front-side contact being electrically connected to the second node of the first transistor; and
a backside contact at the backside portion of the semiconductor die, the backside contact being electrically connected to the second node of the second transistor;
and wherein:
the first electrically conductive clip is electrically connected to the first front-side contact;
the second electrically conductive clip is electrically connected to the second front-side contact; and the backside contact is electrically connected to the electrically conductive paddle.

9. The apparatus of claim 8, wherein:

the first transistor comprises a high-side transistor;

the second transistor comprises a low-side transistor;

the high-side transistor comprises a high-side source, a high-side drain, and a high-side gate, the first node of the first transistor being the high-side source, and the second node of the first transistor being the high-side drain;

the low-side transistor comprises a low-side source, a low-side drain, and a low-side gate, the first node of the second transistor being the low-side drain, and the second node of the second transistor being the low-side source;

the first front-side contact is formed on the front-side active layer above the low-side gate; and the first front-side contact extends laterally from the high-side source to the low-side drain, the low-side gate being situated laterally between the high-side source and the low-side drain.

10. The apparatus of claim 1, further comprising:

a plurality of electrically conductive perimeter package leads;

and wherein:

the first electrically conductive clip is electrically connected to a first set of the plurality of electrically conductive perimeter package leads; and the second electrically conductive clip is electrically connected to a second set of the plurality of electrically conductive perimeter package leads.

11. The apparatus of claim 1, further comprising:

a semiconductor substrate of the semiconductor die;

a substrate contact electrically connected to the semiconductor substrate and the second node of the second transistor;

and wherein:

the substrate contact extends through the front-side active layer to the semiconductor substrate along an axial dimension;

the substrate contact has a top portion that is within a first portion of the front-side active layer and is characterized by a first width in a lateral dimension orthogonal to the axial dimension; and the substrate contact has a bottom portion that is within a second portion of the front-side active layer and the semiconductor substrate and is characterized by a second width in the lateral dimension that is smaller than the first width.

* * * * *